United States Patent
Yamashita et al.

(10) Patent No.: US 7,328,418 B2
(45) Date of Patent: *Feb. 5, 2008

(54) ISO/NESTED CONTROL FOR SOFT MASK PROCESSING

(75) Inventors: Asao Yamashita, Wappingers Falls, NY (US); Merritt Funk, Austin, TX (US); Daniel Prager, Hopewell Junction, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/046,903

(22) Filed: Feb. 1, 2005

(65) Prior Publication Data

US 2006/0195218 A1    Aug. 31, 2006

(51) Int. Cl.
*G06F 17/50* (2006.01)
*G06F 9/45* (2006.01)

(52) U.S. Cl. .............. 716/10; 716/1; 716/19

(58) Field of Classification Search ............ 716/1, 716/10, 19–21; 700/121, 123; 438/8, 72, 438/694; 430/311
See application file for complete search history.

(56) References Cited

U.S. PATENT DOCUMENTS 6,030,541 A * 2/2000 Adkisson et al. ............ 216/51
6,864,041 B2 * 3/2005 Brown et al. ............... 430/316
6,884,734 B2 * 4/2005 Buehrer et al. ............. 438/723
7,008,866 B2 * 3/2006 Huang et al. ............... 438/585
7,209,798 B2 * 4/2007 Yamashita et al. .......... 700/121
2003/0165755 A1   9/2003 Mui et al.
2003/0228532 A1  12/2003 Mui et al.

OTHER PUBLICATIONS

Mitsugu Tajima et al., "Advanced process control for 40nm Gate fabrication," Conf. Proc., 2003 IEEE Int'l Symp. Semiconductor Manufacturing, pp. 115-118, (Sep. 30, 2003).
Wesley C. Natzle et al., "Trimming of Hard-masks by Gaseous Chemical Oxide Removal (COR) for Sub-10nm Gates/Fins, for Gate Length Control and for Embedded Logic," ASMC '04 IEEE Conference and Workshop, pp. 61-65, (May 4-6, 2004).
Masatoshi Nagase et al., "Advanced Gate Etching for Accurate CD Control for 130-nm Node ASIC Manufacturing," IEEE Transactions on Semiconductor Manufacturing, vol. 17 (No. 3), pp. 281-285, (Aug. 2004).

* cited by examiner

*Primary Examiner*—Jack Chiang
*Assistant Examiner*—Nghia M. Doan

(57) ABSTRACT

This method includes a method for etch processing that allows the bias between isolated and nested structures/features to be adjusted, correcting for a process wherein the isolated structures/features need to be smaller than the nested structures/features and wherein the nested structures/features need to be reduced relative to the isolated structures/features, while allowing for the critical control of trimming.

19 Claims, 25 Drawing Sheets

| STEP | 1 | 2 | 3 | 4 | 5 | 6 | 7 | 8 | 9 | 10 | 11 | 12 |
|---|---|---|---|---|---|---|---|---|---|---|---|---|
| CHAMBER PRESSURE(mT) | 12 | 12 | 7 | 7 | 20 | 20 | 20 | 20 | 40 | 40 | 25 | 25 |
| UPPER RF POWER(W) | 0 | 300 | 0 | 300 | 0 | 800 | 0 | 200 | 0 | 135 | 0 | 300 |
| LOWER RF POWERrr(W) | 0 | 0 | 0 | 65 | 0 | 180 | 0 | 100 | 0 | 60 | 0 | 75 |
| HBr | 0 | 0 | 0 | 0 | 0 | 0 | 450 | 450 | 500 | 500 | 250 | 250 |
| HBr | 0 | 0 | 0 | 0 | 0 | 0 | 0 | 0 | 0 | 0 | 0 | 0 |
| Cl2 | 0 | 0 | 0 | 0 | 0 | 0 | 0 | 0 | 0 | 0 | 0 | 0 |
| SF6 | 0 | 0 | 0 | 0 | 0 | 0 | 0 | 0 | 0 | 0 | 0 | 0 |
| SF6 | 0 | 0 | 0 | 0 | 0 | 0 | 0 | 0 | 0 | 0 | 0 | 0 |
| CF4 | 48 | 48 | 70 | 70 | 75 | 75 | 0 | 0 | 0 | 0 | 0 | 0 |
| O2 | 12 | 12 | 0 | 0 | 0 | 0 | 0 | 0 | 0 | 0 | 0 | 0 |
| O2 | 0 | 0 | 1.5 | 1.5 | 0 | 0 | 1.7 | 1.7 | 5 | 5 | 9 | 9 |
| CHF3 | 0 | 0 | 0 | 0 | 0 | 0 | 0 | 0 | 0 | 0 | 0 | 0 |
| NF3 | 0 | 0 | 0 | 0 | 20 | 20 | 0 | 0 | 0 | 0 | 0 | 0 |
| C4F8 | 0 | 0 | 10 | 10 | 0 | 0 | 0 | 0 | 0 | 0 | 0 | 0 |
| NONE | 0 | 0 | 0 | 0 | 0 | 0 | 0 | 0 | 0 | 0 | 0 | 0 |
| CH2F2 | 0 | 0 | 0 | 0 | 0 | 0 | 0 | 0 | 0 | 0 | 0 | 0 |
| AR | 0 | 0 | 0 | 0 | 0 | 0 | 0 | 0 | 0 | 0 | 0 | 0 |
| N2 | 0 | 0 | 0 | 0 | 50 | 50 | 0 | 0 | 0 | 0 | 0 | 0 |
| HE | 0 | 0 | 0 | 0 | 0 | 0 | 0 | 0 | 440 | 440 | 200 | 200 |
| WAFER COOLING | ON | ON | ON | ON | ON | ON | ON | ON | ON | ON | ON | ON |
| EDGE He PRESSURE(T) | 50 | 50 | 50 | 50 | 50 | 50 | 50 | 50 | 50 | 50 | 50 | 50 |
| CENT.He PRESSURE(T) | 3 | 3 | 3 | 3 | 3 | 3 | 3 | 3 | 3 | 3 | 3 | 3 |
| STEP COMPLETION COND. | STAB | T/E | STAB | E/P | STAB | T/E | STAB | T/E | STAB | E/P | STAB | T/E |
| STEP PROCESS TIME(sec) | 60 | 15 | 60 | 120 | 60 | 60 | 60 | 55 | 60 | 90 | 60 | 60 |
| OVER ETCH(%) | 0 | 0 | 0 | 0 | 0 | 0 | 0 | 0 | 0 | 0 | 0 | 0 |
| STEP LOWER LIMIT TIME(sec) | 0.1 | 0.1 | 0.1 | 0.1 | 0.1 | 0.1 | 0.1 | 0.1 | 0.1 | 0.1 | 0.1 | 0.1 |
| VARIABLE | 0 | 0 | 0 | 0 | 0 | 0 | 0 | 0 | 0 | 0 | 0 | 0 |
| DETECT UNIT | 11(B) | 11(B) | 11(B) | 11(B) | 11(A) | 11(A) | 11(B) | 11(A) | 11(B) | 2(A) | 11(B) | 2(A) |

ISO/NESTED CONTROL FOR SOFT MASK PROCESSING

CROSS-REFERENCE TO RELATED APPLICATIONS

This patent application is related to commonly owned co-pending U.S. patent application Ser. No. 10/944,463 filed Sep. 20, 2004, and entitled "Iso/Nested Cascading Trim Control with Model Feedback Updates", which is hereby incorporated by reference in its entirety.

FIELD OF THE INVENTION

The invention relates to semiconductor wafer processing. More particularly, the invention relates to processing a wafer having isolated and nested structures using a soft mask.

BACKGROUND OF THE INVENTION

The use of feed forward controllers in semiconductor processing has long been established in the fabrication of semiconductor integrated circuits by semiconductor manufacturing facilities (fabs). Until recently, wafers were treated as a batch or a lot and the same processing performed on each of the wafers in the lot. The size of the lot varies depending on the manufacturing practices of the fab but is typically limited to a maximum of 25 wafers. Measurements were routinely made on a few wafers in the lot and adjustments made to the processing based on these sample measurements. This method of control based on sample measurements on the lot and process recipe adjustments for the following lots is called lot-to-lot control (L2L). The process models and information necessary to modify the process recipes for L2L control were kept and the computations were performed at the fab level. Recently, manufacturers of semiconductor processing equipment (SPE) have included the ability to measure each wafer immediately before and after the processing is performed. The capability to measure each wafer on the processing tool is called integrated metrology (IM). IM enabled the ability to measure and adjust the process recipe at the wafer-to-wafer (W2W) level.

The structures on the semiconductor wafers have not only decreased in size but also have increased in density causing additional processing control problems. Areas on semiconductor wafers have been identified as being isolated areas or nested areas based on the density of structures within the particular area and problems have developed in the semiconductor processing due to these different densities.

The need for trim etch has become common, with many methods for trimming the Critical Dimension (CD) for gate length control. Iso/nested control has become part of the mask design process, including the modeling of the process through the etcher. The iso/nested model designed into the mask making process however is optimized for a single CD target related to an isolated or nested structure. As the need to shrink the gate by trimming and the need to change gate targets change over time, it is expensive to create new masks and re-optimize the iso/nested bias. The mask bias control is by use of the optical and process correction (OPC), sometimes called optical proximity correction, in which the apertures of the reticle are adjusted to add or subtract the necessary light to increase pattern fidelity. Another approach is phase-shift masks (PSM), in which topographic structures are created on the reticle to introduce contrast-enhancing interference fringes in the image. Another problem can occur when designers learn after the mask is made that the iso/nested bias requires adjusting to optimize performance after the mask is generated and the first setup sample parts are created.

What has not been addressed is a method to adjust the wafer CD bias between isolated and nested lines after patterning as part of the etch process when a soft mask is used.

SUMMARY OF THE INVENTION

The invention provides a method of operating a semiconductor processing system that includes: receiving a wafer that comprises a soft mask layer and a bottom anti-reflective coating (BARC) layer; receiving input data comprising reference metrology data for the wafer including reference metrology data for at least one isolated structure on the wafer, reference metrology data for at least one nested structure on the wafer, soft mask data, and BARC data; determining a first value using a feature size for the at least one isolated structure on the wafer; determining a second value using a feature size for the at least one nested structure on the wafer; executing an Iso-Greater control strategy when the first value is greater than or equal to the second value, wherein the Iso-Greater control strategy comprises an Iso/Nested control plan for controlling an iso/nested etching process, a Trim Control plan for controlling a trimming process, or a BARC open control plan for controlling a BARC etching process, or a combination of two or more thereof; and executing a Nes-Greater control strategy when the first value is less than the second value, wherein the Nes-Greater control strategy comprises an Iso/Nested control plan for controlling an iso/nested deposition process, a Trim Control plan for controlling a trimming process, or a BARC open control plan for controlling a BARC etching process, or a combination of two or more thereof.

In one aspect of the invention the procedure for executing an Iso-Greater control strategy includes: determining a desired target value for an iso/nested etching process, the target value comprising a desired feature size after performing the iso/nested etching process; calculating an iso-trim value using the difference between the first value and the target value, wherein the first value comprises measured data for an isolated structure; calculating a dense-trim value using the difference between the second value and the target value, wherein the second value comprises measured data for a nested structure; calculating a ratio using the iso-trim value and the dense-trim value; executing the iso/nested etching process, wherein recipe settings for achieving the desired target value have been determined using the calculated ratio; determining a final CD target; calculating a trim value using a difference between the final CD target and the desired target value; and executing a trim process, wherein recipe settings for achieving the final CD target have been determined using the trim value. In addition, a BARC open process can be executed.

In another aspect of the invention the procedure for executing another Iso-Greater control strategy includes: determining a desired trim value for a trim process, the desired trim value comprising a trim amount to be removed from the first value and the second value after performing the trim process, wherein the first value comprises measured data for an isolated structure and the second value comprises measured data for a nested structure; executing the trim process, wherein recipe settings for achieving the desired trim value have been determined to achieve a first trimmed value and a second trimmed value; determining a final CD value; calculating an iso-trim value using the difference between the first trimmed value and the final CD value, wherein the first trimmed value comprises the measured data for an isolated structure less the trim amount; calculating a dense-trim value using the difference between the second trimmed value and the final CD value, wherein the second trimmed value comprises measured data for a nested structure less the trim amount; calculating a ratio using the iso-trim value and the dense-trim value; and executing the iso/nested etching process, wherein recipe settings for achieving the final CD value have been determined using the calculated ratio. In addition, a BARC open process can be executed.

In another aspect of the invention the procedure for executing another Iso-Greater control strategy includes: determining a desired target value for an iso/nested etching process, the target value comprising a desired feature size after performing the iso/nested etching process; calculating an iso-trim value using the difference between the first value and the target value, wherein the first value comprises measured data for an isolated structure; calculating a dense-trim value using the difference between the second value and the target value, wherein the second value comprises measured data for a nested structure; calculating a ratio using the iso-trim value and the dense-trim value; executing the iso/nested etching process, wherein recipe settings for achieving the desired target value have been determined using the calculated ratio; executing a BARC open process; determining a final CD target; calculating a trim value using a difference between the final CD target and the desired target value; and executing a trim process, wherein recipe settings for achieving the final CD target have been determined using the trim value.

In another aspect of the invention the procedure for executing another Iso-Greater control strategy includes: determining a desired trim value for a trim process, the desired trim value comprising a trim amount to be removed from the first value and the second value after performing the trim process, wherein the first value comprises measured data for an isolated structure and the second value comprises measured data for a nested structure; executing the trim process, wherein recipe settings for achieving the desired trim value have been determined to achieve a first trimmed value and a second trimmed value; executing a BARC open process; determining a final CD value; calculating an iso-trim value using the difference between the first trimmed value and the final CD value, wherein the first trimmed value comprises the measured data for an isolated structure less the trim amount; calculating a dense-trim value using the difference between the second trimmed value and the final CD value, wherein the second trimmed value comprises measured data for a nested structure less the trim amount; calculating a ratio using the iso-trim value and the dense-trim value; and executing the iso/nested etching process, wherein recipe settings for achieving the final CD value have been determined using the calculated ratio.

In another aspect of the invention the procedure for executing a Nes-Greater control strategy includes: determining a desired target value for an iso/nested deposition process, the target value comprising a desired feature size after performing the iso/nested deposition process; calculating an iso-trim value using the difference between the first value and the target value, wherein the first value comprises measured data for an isolated structure; calculating a dense-trim value using the difference between the second value and the target value, wherein the second value comprises measured data for a nested structure; calculating a ratio using the iso-trim value and the dense-trim value; executing the iso/nested deposition process, wherein recipe settings for achieving the desired target value have been determined using the calculated ratio; determining a final CD target; calculating a trim value using a difference between the final CD target and the desired target value; and executing a trim process, wherein recipe settings for achieving the final CD target have been determined using the trim value. In addition, a BARC open process can be executed.

In another aspect of the invention, the procedure for executing another Nes-Greater control strategy includes: determining a desired trim value for a trim process, the desired trim value comprising a trim amount to be removed from the first value and the second value after performing the trim process, wherein the first value comprises measured data for an isolated structure and the second value comprises measured data for a nested structure; executing the trim process, wherein recipe settings for achieving the desired trim value have been determined to achieve a first trimmed value and a second trimmed value; determining a final CD value; calculating an iso-trim value using the difference between the first trimmed value and the final CD value, wherein the first trimmed value comprises the measured data for an isolated structure less the trim amount; calculating a dense-trim value using the difference between the second trimmed value and the final CD value, wherein the second trimmed value comprises measured data for a nested structure less the trim amount; calculating a ratio using the iso-trim value and the dense-trim value; and executing the iso/nested deposition process, wherein recipe settings for achieving the final CD value have been determined using the calculated ratio. In addition, a BARC open process can be executed.

In another aspect of the invention the procedure for executing another Nes-Greater control strategy includes: determining a desired target value for an iso/nested deposition process, the target value comprising a desired feature size after performing the iso/nested deposition process; calculating an iso-trim value using the difference between the first value and the target value, wherein the first value comprises measured data for an isolated structure; calculating a dense-trim value using the difference between the second value and the target value, wherein the second value comprises measured data for a nested structure; calculating a ratio using the iso-trim value and the dense-trim value; executing the iso/nested deposition process, wherein recipe settings for achieving the desired target value have been determined using the calculated ratio; executing a BARC open process; determining a final CD target; calculating a trim value using a difference between the final CD target and the desired target value; and executing a trim process, wherein recipe settings for achieving the final CD target have been determined using the trim value.

In another aspect of the invention the procedure for executing another Nes-Greater control strategy includes: determining a desired trim value for a trim process, the desired trim value comprising a trim amount to be removed from the first value and the second value after performing the trim process, wherein the first value comprises measured data for an isolated structure and the second value comprises measured data for a nested structure; executing the trim process, wherein recipe settings for achieving the desired trim value have been determined to achieve a first trimmed value and a second trimmed value; executing a BARC open process; determining a final CD value; calculating an iso-trim value using the difference between the first trimmed value and the final CD value, wherein the first trimmed value comprises the measured data for an isolated structure less the trim amount; calculating a dense-trim value using the difference between the second trimmed value and the final CD value, wherein the second trimmed value comprises measured data for a nested structure less the trim amount; calculating a ratio using the iso-trim value and the dense-trim value; and executing the iso/nested deposition process, wherein recipe settings for achieving the final CD value have been determined using the calculated ratio.

BRIEF DESCRIPTION OF THE DRAWINGS

A more complete appreciation of various embodiments of the invention and many of the attendant advantages thereof will become readily apparent with reference to the following detailed description, particularly when considered in conjunction with the accompanying drawings, in which:

FIG. 7 provides an exemplary recipe table, listing various processing parameters in accordance with the invention;

FIG. 16 illustrates an exemplary view of an Iso/Nested Control Strategy Screen in accordance with an embodiment of the invention;

FIG. 18 illustrates an exemplary view of a Isolated Control Plan Editor Screen in accordance with an embodiment of the invention; and FIG. 19 illustrates an exemplary view of a Formula Model Editor Screen in accordance with an embodiment of the invention.

DETAILED DESCRIPTION OF SEVERAL EMBODIMENTS

Figure 1:
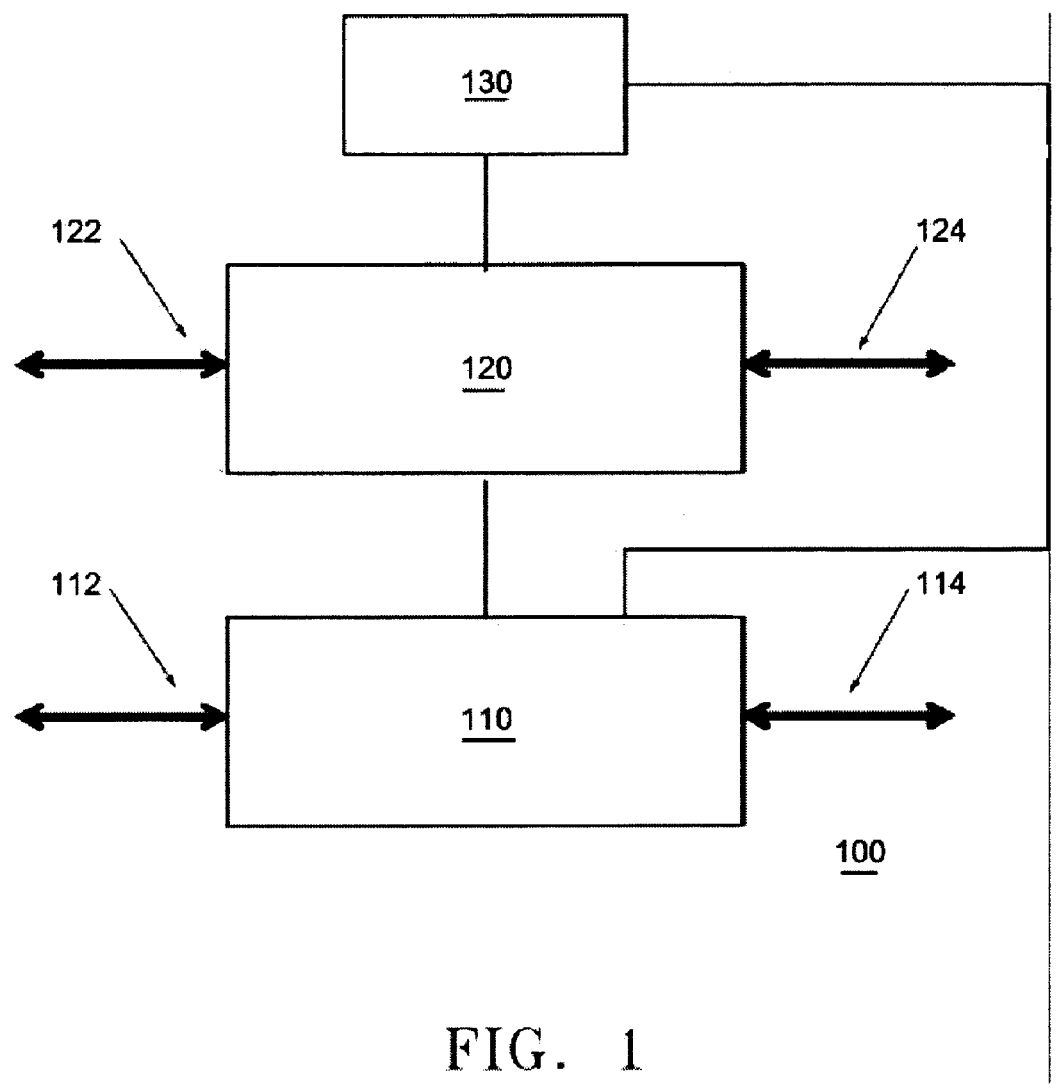
FIG. 1 shows an exemplary block diagram of a processing system in accordance with an embodiment of the present invention.

Various embodiments of the present invention are discussed below. Where appropriate, like reference numerals are used to refer to like features. The embodiments presented herein are intended to be merely exemplary of the wide variety of embodiments contemplated within the scope of the present invention, as would be appreciated by those skilled in the art. Accordingly, the invention is not limited solely to the embodiments presented but also encompasses any and all variations and equivalents that would be appreciated by those skilled in the art.

In semiconductor processing, the etch results tend to differ based on the geometry of the features. For example, features can include narrow features and spaces, wide features and spaces, isolated features and spaces, and nested features and spaces. Some of these features can have different etch rates, and the different etch rates can create problem during the manufacturing process. The present invention provides a method and apparatus for processing features having different characteristics to improve performance of the semiconductor devices produced thereby.

FIG. 1 shows an exemplary block diagram of a processing system in accordance with an embodiment of the present invention. In the illustrated embodiment, processing system 100 comprises a processing tool 110, a controller 120 coupled to the processing tool 110, and a manufacturing equipment system (MES) 130 coupled to the controller 120. In addition, at least one of the processing tool 110, the controller 120, and the MES 130 can comprise a GUI component and/or a database component (not shown). In alternate embodiments, the GUI component and/or the database component are not required.

The system components 110, 120, and 130 can include memory (not shown) for storing information and instructions to be executed by the system 100. In addition, the memory may be used for storing temporary variables or other intermediate information during the execution of instructions by the various processors in the system 100. One or more of the system components 110, 120, and 130 can comprise the means for reading data and/or instructions from a computer readable medium. In addition, one or more of the system components 110, 120, and 130 can comprise the means for writing data and/or instructions to a computer readable medium.

The semiconductor processing system 100 performs a portion of or all of the processing steps of the invention in response to the controller 120 executing one or more sequences of one or more instructions contained in a memory. Such instructions may be received by the controller 120 from another computer, a computer readable medium, or a network connection.

Stored on any one or on a combination of computer readable media, the present invention includes software for controlling the semiconductor processing system 100, for driving a device or devices for implementing the invention, and for enabling the semiconductor processing system 100 to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The term "computer readable medium" as used herein refers to any medium that participates in providing instructions to the processor for execution. A computer readable medium may take many forms, including but not limited to, non-volatile media, volatile media, and transmission media. Non-volatile media include, for example, optical, magnetic disks, and magneto-optical disks. Volatile media include, but are not limited to, a dynamic memory, and transmission media include, among other examples, coaxial cables, copper wire and fiber optics. Transmission media also may take the form of acoustic or light waves, such as those generated during radio wave and infrared data communications (e.g., wireless transmission media).

Links 122 and 124 can provide hardwired two-way data communication paths. Alternately, wireless links may also be implemented. The links 122 and 124 may provide a connection to another computer through a local network. The links 122 and 124 can be used to transmit and/or receive data. In addition, the links 122 and 124 may provide a connection to a mobile device such as a personal digital assistant (PDA) laptop computer, or cellular telephone, to name but a few examples.

Some setup and/or configuration information can be obtained by the processing tool 110 and/or the controller 120 from the factory system 130. Factory level business rules can be used to establish a control hierarchy. For example, the processing tool 110 and/or the controller 120 can operate independently, or can be controlled to some degree by the factory system 130. In addition, factory level business rules can be used to determine when a process is paused and/or stopped, and what is done when a process is paused and/or stopped. In addition, factory level business rules can be used to determine when to change a process and how to change the process.

Business rules can be used to specify the action taken for normal processing and the actions taken on exceptional conditions. The actions can include, for example: initial model loading, pre-etch metrology data filtering, controller recipe selection, post-etch metrology data filtering, feedback calculation, and a model update.

Business rules can be defined at a control strategy level, a control plan level or a control model level. Business rules can be assigned to execute whenever a particular context is encountered. When a matching context is encountered at a higher level as well as a lower level, the business rules associated with the higher level can be executed. GUI screens can be used for defining and maintaining the business rules. Business rule definition and assignment can be allowed for users with greater than normal security level. The business rules can be maintained in the database. Documentation and help screens can be provided on how to define, assign, and maintain the business rules.

The MES 130 can monitor some system processes using data reported from the databases associated with the processing tool 110 and/or the controller 120. Factory level business rules can be used to determine which processes are monitored and which data is used. For example, the processing tool 110 and/or the controller 120 can independently collect data, or the data collection process can be controlled to some degree by the factory system 130. In addition, factory level business rules can be used to determine how to manage the data when a process is changed, paused, and/or stopped.

In addition, the MES 130 can provide run-time configuration information to the processing tool 110 and/or the controller 120. For example, automated process control (APC) settings, targets, limits, rules, and algorithms can be downloaded from the factory to the processing tool 110 and/or the controller 120 as an "APC recipe", an "APC system rule", and "APC recipe parameters" at run-time.

Some setup and/or configuration information can be determined by the processing tool 110 and/or the controller 120 when they are initially configured by the system 100. System level business rules (system rules) can be used to establish a control hierarchy. For example, the processing tool 110 and/or the controller 120 can operate independently, or the processing tool 110 can be controlled to some degree by the controller 120. In addition, system rules can be used to determine when a process is paused and/or stopped, and what is done when a process is paused and/or stopped. In addition, system rules can be used to determine when to change a process and how to change the process. Furthermore, the controller 120 can use tool level rules to control some tool level operations.

In general, rules allow system and/or tool operation changes based on the dynamic state of the system 100.

In FIG. 1, one processing tool 110, and one controller 120 are shown, but this is not required for the invention. The semiconductor processing system 100 can comprise any number of processing tools having any number of controllers associated with them in addition to independent process tools and modules.

The processing tool 110 and/or the controller 120 can be used to configure any number of processing tools having any number of processing tools associated with them in addition to any number of independent process tools and modules. The processing tool 110 and/or the controller 120 can collect, provide, process, store, and display data from processes involving processing tools, processing subsystems, process modules, and sensors.

The processing tool 110 and/or the controller 120 can comprise a number of applications including at least one tool-related application, at least one module-related application, at least one sensor-related application, at least one interface-related application, at least one database-related application, at least one GUI-related application, and at least one configuration application.

For example, the system 100 can comprise an APC system from Tokyo Electron Limited that can include a Unity Tool™, Telius Tool™, and/or a Trias Tool™ and their associated processing subsystems and process modules. In addition, the system can comprise a run-to-run (R2R) controller, such as the Ingenio TL ES (Tool Level Etch System) server from Tokyo Electron Limited, and an integrated metrology module (IMM) from Tokyo Electron Limited. Alternately, the controller 120 can support other process tools and other process modules.

A GUI component (not shown) can provide easy to use interfaces that enable users to: view tool status and process module status; create and edit x-y charts of summary and raw (trace) parametric data for selected wafers; view tool alarm logs; configure data collection plans that specify conditions for writing data to the database or to output files; input files to statistical process control (SPC) charting, modeling and spreadsheet programs; examine wafer processing information for specific wafers, and review data that is currently being saved to the database; create and edit SPC charts of process parameters, and set SPC alarms which generate e-mail warnings; run multivariate PCA (Principal Component Analysis) and/or PLS (Partial Least Squares) models; and view diagnostics screens in order to troubleshoot and report problems with the TL (Tool Level) controller 120.

Raw data and trace data from the tool can be stored as files in a database. In addition, IM (Integrated Metrology) data and host metrology data can be stored in the database. The amount of data depends on the data collection plans that are configured, as well as the frequency with which processes are performed and processing tools are run. The data obtained from the processing tools, the processing chambers, the sensors, and the operating system can be stored in the database.

In an alternate embodiment, the system 100 can comprise a client workstation (not shown). The system 100 can support a plurality of client workstations. A client workstation can allow a user to perform configuration procedures; to view status including tool, controller, process, and factory status; to view current and historical data; to perform modeling and charting functions; and to input data to the controller. For example, a user may be provided with administrative rights that allow him to control one or more processes performed by a controller.

The processing tool 110 and the controller 120 can be coupled to the MES 130 and can be part of an E-Diagnostic System. The processing tool 110 and/or the controller 120 can exchange information with a factory system. In addition, the MES 130 can send command and/or override information to the processing tool 110 and/or the controller 120. For example, the MES 130 can feed-forward to the processing tool 110 and/or the controller 120 downloadable recipes for any number of process modules, tools, and measuring devices, with variable parameters for each recipe. Variable parameters can include final CD targets, limits, offsets, and variables in the tool level system that needs to be adjustable by lot. In addition, factory litho CD metrology data can be feed-forwarded to controller 120.

Furthermore, the MES 130 can be used to provide measurement data, such as CD SEM (Critical Dimension-Scanning Electron Microscope) information, to the controller 120. Alternately, the CD SEM information can be provided manually. Adjustment factors are used to adjust for any offset between the IM and CD SEM measurements. Manual and automated input of CD SEM data includes a timestamp, such as a date, for proper insertion in to the history of the FB (Feed Back) control loop in the R2R controller.

Configurable items can be configured as a set of variable parameters sent from the factory system using GEM SECS (Generic Equipment Model/SEMI Equipment Communication Standard) communications protocol. For example, variable parameters can be passed as part of an "APC Recipe". An APC recipe may contain more than one sub recipes and each sub recipe can contain variable parameters.

A single processing tool 110 is shown in FIG. 1, but this is not required for the invention. Alternately, additional processing tools can be used. In one embodiment, a processing tool 110 can comprise one or more processing modules. The processing tool 110 can comprise at least one of an etch module, a deposition module, a polishing module, a coating module, a developing module, and a thermal treatment module, among others.

The processing tool 110 can comprise links 112 and 114 for coupling to at least one other processing tool and/or at least one other controller. For example, other processing tools and/or controllers can be associated with a process that has been performed before this process, and/or other controllers can be associated with a process that is performed after this process. The link 112 and the link 114 can be used to feed forward and/or feed back information. For example, feed forward information can comprise data associated with an incoming wafer. This data can include lot data, batch data, run data, composition data, and wafer history data. The data can comprise pre-process data that can be used to establish an input state for a wafer. A first part of the pre-process data can be provided to the controller 120, and a second part of the pre-process data can be provides to the processing tool 110. Alternately, the two parts can comprise the same data.

The processing tool 110 can comprise a single integrated metrology module (IMM) device (not shown) or multiple measurement devices. The system 100 can include module related measurement devices, tool-related measurement devices, and external measurement devices. For example, data can be obtained from sensors coupled to one or more process modules and sensors coupled to the processing tool. In addition, data can be obtained from an external device such as a SEM (Scanning Electron Microscope) tool and an Optical Digital Profiling (ODP) tool. An ODP tool is available for Timbre Technologies Inc. (a TEL (Tokyo Electron Limited) company) that provides a patented technique for measuring the profile of a structure in a semiconductor device. For example, ODP techniques can be used to obtain CD information, structure profile information, or via profile information.

ODP techniques for creating a metrology model are taught in co-pending U.S. patent application Ser. No. 10/206,491, entitled "Model and Parameter Selection in Optical Metrology" by Voung, et al., filed on Jul. 25, 2002 and ODP techniques covering integrated metrology applications are taught in U.S. Pat. No. 6,785,638, entitled METHOD AND SYSTEM OF DYNAMIC LEARNING THROUGH A REGRESSION-BASED LIBRARY GENERATION PROCESS, filed on Aug. 6, 2001, and both of which are incorporated by reference herein.

The controller 120 is coupled to the processing tool 110 and the MES 130, and information such as pre-processing data and post-processing data can be exchanged between them. For example, when an internal reset event is being generated from the tool 110, the controller 120 can send a message, such as an alarm, to the MES 130. This can allow the factory system and/or factory personnel to make the necessary changes to minimize the number of wafers at risk after a major change occurs such as those that occur during corrective or preventative maintenance.

A single controller 120 is also shown in FIG. 1, but this is not required for the invention. Alternately, additional controllers can be used. For example, the controller 120 can comprise a run-to-run (R2R) controller, a feed-forward (FF) controller, process model controller, feedback (FB) controller, or a process controller, or a combination of two or more thereof (all not shown in FIG. 1).

The controller 120 can comprise links 122 and 124 for coupling to at least one other controller. For example, other controllers can be associated with a process that has been performed before this process, and/or other controllers can be associated with a process that is performed after this process. The link 122 and the link 124 can be used to feed forward and/or feed back information.

The controller 120 can use the difference between a measured critical dimension of the incoming material (input state) and a target critical dimension (desired state) to predict, select, or calculate a set of process parameters to achieve a desired process result that is changing the state of the wafer from the input state to the desired state. For example, this predicted set of process parameters can be a first estimate of a recipe to use based on an input state and a desired state. In one embodiment, data such the input state and/or the desired state data can be obtained from a host.

In one case, the controller 120 knows the input state and a model equation for the desired state for the wafer, and the controller determines a set of recipes that can be performed on the wafer to change the wafer from the input state to a processed state. For example, the set of recipes can describe a multi-step process involving a set of process modules.

The time constant for the controller 120 can be based on the time between measurements. When measured data is available after a lot is completed, the controller's time constant can be based on the time between lots. When measured data is available after a wafer is completed, the controller's time constant can be based on the time between wafers. When measurement data is provided real-time during processing, the controller's time constant can be based on processing steps, within a wafer. When measured data is available while a wafer is being processed or after a wafer is completed or after the lot is completed, the controller 120 can have multiple time constants that can be based on the time between process steps, between wafers, and/or between lots.

One or more controllers can be operating at any point in time. For example, one controller can be in an operating mode while a second controller can be in a monitoring mode. In addition, another controller can be operating in a simulation mode. A controller can comprise a single loop or multiple loops, and the loops can have different time constants. For example, loops can be dependent on wafer timing, lot timing, batch timing, chamber timing, tool timing, and/or factory timing, among other parameters.

The controller 120 can compute a predicted state for the wafer based on the input state, the process characteristics, and a process model. For example, a trim rate model can be used along with a processing time to compute a predicted trim amount. Alternately, an etch rate model can be used along with a processing time to compute an etch depth, and a deposition rate model can be used along with a processing time to compute a deposition thickness. In addition, models can include SPC (Statistical Process Control) charts, PLS (Partial Least Squares) models, PCA (Principle Component Analysis) models, Fitness Distance Correlation (FDC) models, and Multivariate Analysis (MVA) models.

The controller 120 can receive and utilize externally provided data for process parameter limits in a process module. For example, the controller GUI component provides a means for the manual input of the process parameter limits. In addition, a factory level controller can provide limits for process parameters for each process module.

The controller 120 can receive and execute models created by commercially available modeling software. For example, the controller can receive and execute models (PLS, PCA, etc.) that were created by external applications and sent to the controller 120.

The controller 120 can comprise one or more filters (not shown) to filter the metrology data in order to remove any random noise. An outlier filter can be used to remove outliers that are statically not valid and should not be considered in the calculation of the mean of a wafer measurement. A noise filter can be used to remove random noise and stabilize the control loop, an Exponentially Weighed Moving Average (EWMA) or Kalman filter can be applied.

The controller 120 can send and receive notification of an exception condition. For example, the controller 120 can send and receive notifications to and from a factory level controller or a tool level controller. In addition, a notification can be sent via the e-Diagnostics network, e-mail, or pager after the identification of an exception condition.

The controller 120 can comprise a database component for archiving input and output data. For example, the controller 120 can archive received inputs, sent outputs, and actions taken by the controller 120 in a searchable database. In addition, the controller 120 can comprise means for data backup and restoration. In addition, the searchable database can include model information, configuration information, and historical information and the controller 120 can use the database component to backup and restore model information and model configuration information both historical and current.

The controller 120 can comprise a web based user interface. For example, the controller 120 can comprise a web enabled GUI component for viewing the data in the database. The controller 120 can comprise a security component that can provide for multiple levels of access depending on the permissions granted by a security administrator. The controller 120 can comprise a set of default models that are provided at installation time, so that the controller 120 can reset to default conditions.

The controller 120 can take various actions in response to an exception, depending on the nature of the exception. The actions taken on exception can be based on the business rules established for the context specified by the system recipe, process recipe, module type, module identification number, load port number, cassette number, lot number, control job ID, process job ID and/or slot number.

The controller 120 has the capability of managing multiple process models that are executed at the same time and are subject to different sets of process-recipe constraints. The controller 120 can run in three different modes: simulation mode, test mode, and standard mode. The controller 120 can operate in simulation mode in parallel with the actual process mode.

When the semiconductor processing system 100 includes a host system and one or more processing systems, the host system can operate as the master system and can control and/or monitor a major portion of the processing operations. The host system can create a process sequence, and can send the process sequence to the processing system 100. In one embodiment, the process sequence can comprise a sequence of measurement module visits and processing module visits. A process job (PJ) can be created for each measurement module visit and each processing module visit.

In addition, virtual measurements can be made when a processing system controller executes a simulation model. The results from simulation model executions can be stored and tracked as virtual measurements.

Figure 2:
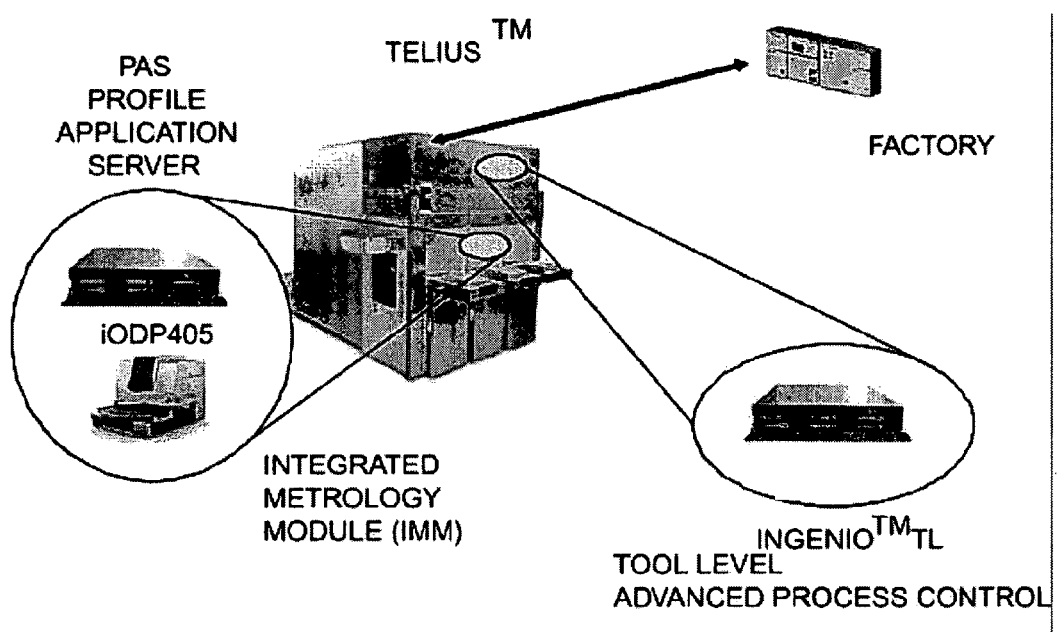
FIG. 2 shows a simplified block diagram of an integrated processing system in accordance with an embodiment of the invention.

FIG. 2 shows a simplified block diagram of an integrated processing system in accordance with an embodiment of the invention. In the illustrated embodiment, a processing system (TELIUS™) is shown that comprises a processing tool, an integrated metrology module (IMM), and a tool level Advanced Process Control (APC) controller.

A system such as shown in FIG. 2 can provide IMM wafer sampling and the wafer slot selection can be determined using a function such as a PJ Create function. The R2R control configuration can include feed forward control plan variables, feedback control plan variables, metrology calibration parameters, control limits, and SEMI (Semiconductor Equipment and Materials International) Standard variable parameters. Metrology data reports can include wafer, site, structure, and composition data, and the tool can report actual settings for the wafer.

The IMM system can include an optical measuring system such as a Timbre Technologies' Optical Digital Profilometry (ODP™) system that uses spectroscopic ellipsometry, reflectometry, or other optical instruments to measure true device profiles, accurate critical dimensions (CD), and multiple layer film thickness of a wafer. The process is executed in-line, which eliminates the need to break the wafer for performing the analyses. ODP™ can be used with the existing thin film metrology tools for inline profile and CD measurement, and can also be integrated with TEL (Tokyo Electron Limited) processing tools to provide real-time process monitoring and control. ODP™ Profiler™ can be used both as a high precision metrology tool to provide actual profile, CD, and film thickness results, and a yield enhancement tool to detect in-line process excursion or process faults.

ODP™ solution has three key components: ODP™ Profiler™ Library comprises an application specific database of optical spectra and its corresponding semiconductor profiles, CDs, and film thicknesses. Profiler™ Application Server (PAS) comprises a computer server that connects with optical hardware and computer network. It handles the data communication, ODP library operation, measurement process, results generation, results analysis, and results output. The ODP™ Profiler™ Software includes the software installed on PAS to manage measurement recipe, ODP™ Profiler™ library, ODP™ Profiler™ data, ODP™ Profiler™ results search/match, ODP™ Profiler™ results calculation/analysis, data communication, and PAS interface to various metrology tools and computer network.

A control system, such as Ingenio ES system (Ingenio is a trademark of Tokyo Electron Limited and ES is an abbreviation for "Etch System") from Tokyo Electron Limited, can comprise management applications, such as the Ingenio Recipe Management application. For example, the Ingenio Recipe Management can be used to view and/or control a recipe stored in the Ingenio ES Management Sever recipe database that is synchronized with equipment via a network environment from the Ingenio ES Client. An Ingenio ES Client, which can be placed separately at a distance from the factory, provides comprehensive management functions to multiple equipment units. Ingenio Recipe Management, as an Ingenio ES Client utility, can comprise a management application to view and control a recipe stored in the Ingenio ES, and an application to edit recipe data stored in the Ingenio ES Management Sever.

Recipes can be organized in a tree structure that can comprise recipe sets, classes, and recipes that can be displayed as objects. Recipes can include process recipe data, system recipe data, and IMM recipe data. Data can be stored and organized using recipe set. For example, the recipes sets can include an equipment recipe set, a backup recipe set, and a user recipe set. In addition, the data can be organized by class, and classes can include SYSTEM, PM, LLM, and IMM classes. For definitional purposes, SYSTEM refers to system level objects, PM refers to process module objects, LLM refers to load lock module objects, and IMM refers to integrated metrology module objects.

The IMM recipes that are on the processing tool can be used to determine wafer sampling and relationship between slots and IM recipes. IM recipes can exist on IM measurement hardware, can be selected in Telius IMM recipes, can contain pattern recognition information, can be used to identify the chips to sample on each wafer, and can be used to determine which PAS recipe to use. PAS recipes can be used to determine which ODP library to use, and to define the measurement metrics to report, such as CD, SWA, thickness, trench width, and GOF. For definitional purposes, SWA refers to side wall angle and GOF refers to goodness of fit.

Ingenio APC recipes operate as control strategies, and a control strategy can be associated with a processing tool recipe, such as a Telius System Recipe. Wafer level context matching at runtime allows for custom configuration by wafer (slot, waferID, lotID, etc.). A control strategy can include one or more control plans, and a process module and/or measurement module that is being controlled has at least one control plan defined for a visit to the process module and/or measurement module. Control plans can contain models, control limits, targets, and can include static recipes, formula models, and feedback plans.

Control plans can cover multiple process steps within a module, and can be controlled by the factory. Parameter ranges can be defined for each process and/or measurement module, and variable parameter "Limit Ranges" are provided for each control parameter.

Figure 3:
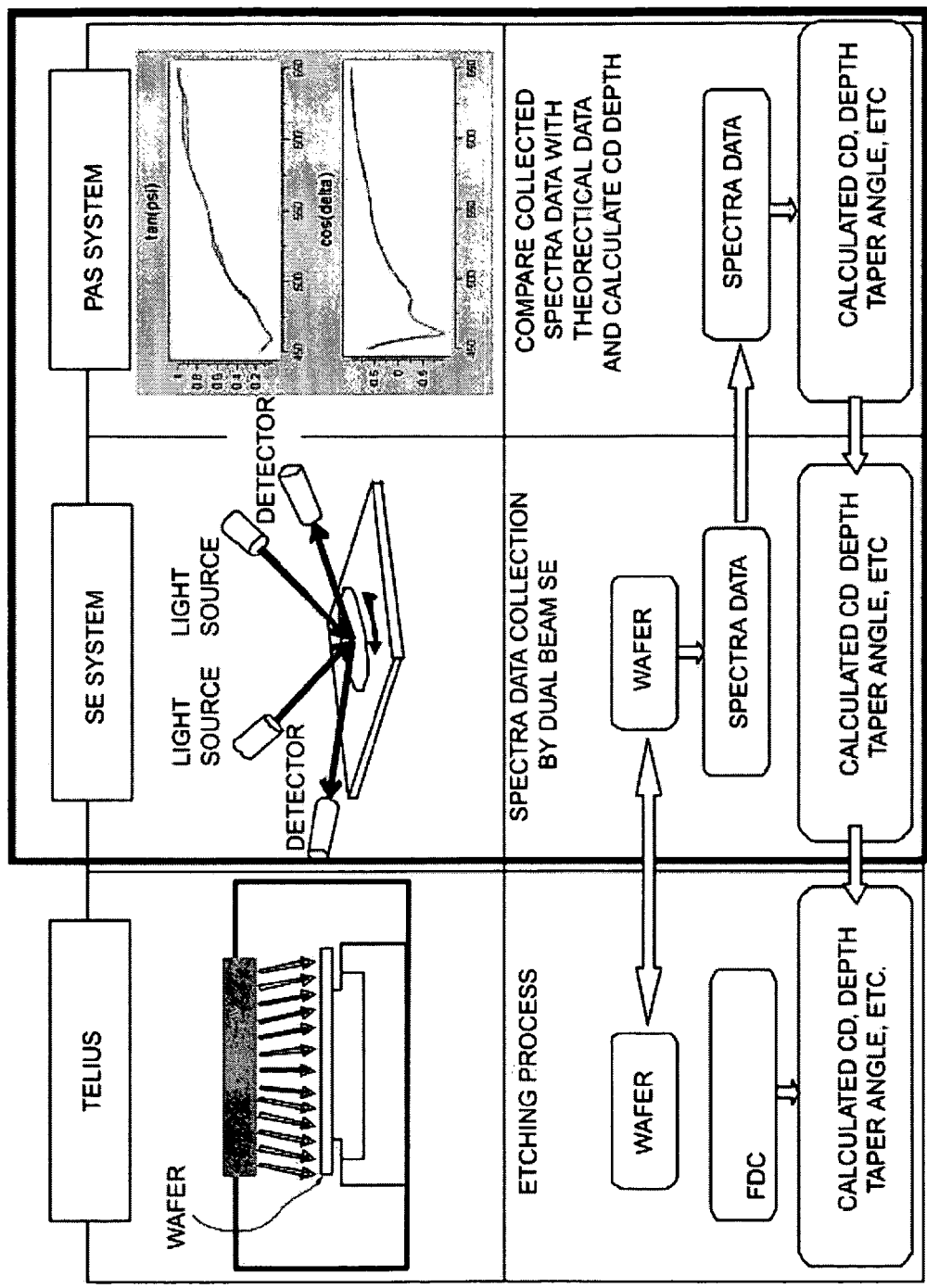
FIG. 3 shows a simplified block diagram of a processing system in accordance with an embodiment of the invention.

FIG. 3 shows a simplified block diagram of a processing system in accordance with an embodiment of the invention. In the illustrated embodiment, a (TELIUS™) processing tool is shown and an integrated metrology (IM) tool is shown.

Spectral data can be collected using a single beam polarizing reflectometer system. The spectral data generated by IM module can be compared to the simulated spectra in an ODP/PAS Library. The matched spectra correspond to a profile with CD, film thickness, and sidewall angle information. Multiple kinds of grating like Iso/Nested can be measured in series.

During an iso/nested measurement sequence, the processing tool selects one IM recipe to use, and separate IMM recipes can be used for iso and nested structures. Each wafer can be measured separately for each pitch and structure.

For example, a wafer can be loaded into an integrated metrology (IM) module; an IM recipe can be loaded into the IM module; and a Profiler Application Server (PAS) recipe can be loaded into the IM controller. Next, the wafer can be measured and an ODP recipe can be loaded into the IM controller. The library can then be searched using the measured spectrum, and one or more isolated structures can be identified. When isolated structures are being measured, IM, PAS, and ODP recipes for isolated structures can be used.

Subsequently, another IM recipe can be loaded into an integrated metrology (IM) module, and another PAS recipe can be loaded into the IM controller. The wafer can be measured or previous measurement data can be used, and another ODP recipe can be loaded into the IM controller. Next, the library can be searched using the measured spectrum, and one or more nested structures can be identified. When Nested structures are being measured, IM, PAS, and ODP recipes for nested structures can be used. The measurement sequence can be performed for one or more different locations on a wafer, and the wafer can be unloaded.

Figure 4:
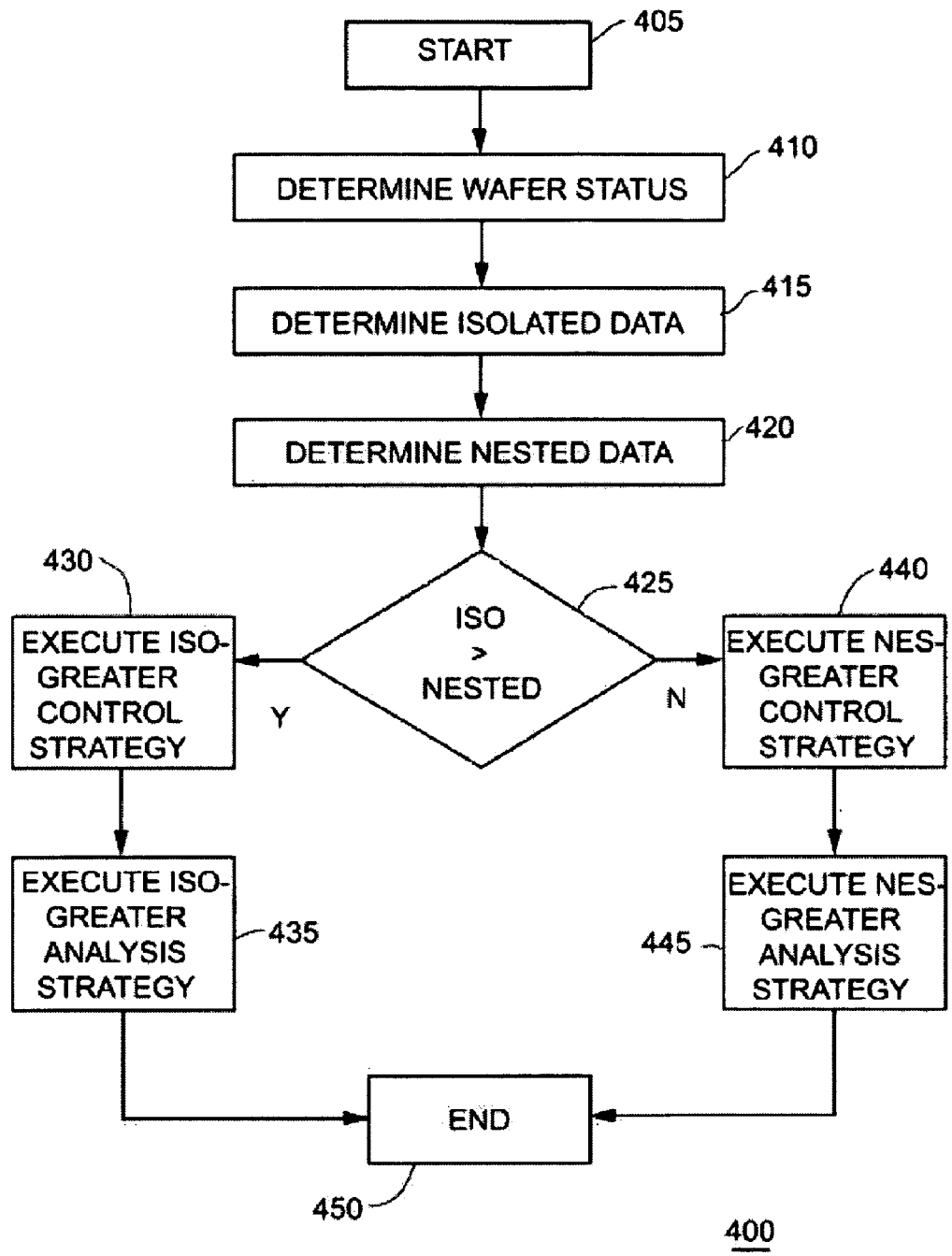
FIG. 4 shows a simplified block diagram of a control process in accordance with an embodiment of the invention.

FIG. 4 shows a simplified flow diagram for an etching process on a wafer that comprises a soft mask layer and a bottom anti-reflective coating (BARC) layer in accordance with an embodiment of the invention. Procedure 400 starts in 405. The wafer can be positioned in a processing chamber by a transfer system. One or more of the wafers can be pre-processed in a measurement tool such as an ODP tool.

In 410, the wafer state is determined. The wafer state can be used to determine the type of processing that is required. For example, the wafer state can be used to determine that a gate stack etch process is required. Input data for the wafer can also be received and processed. The input data can comprise configuration information that characterizes the present state of the wafer and can include at least one of layer data, soft mask data, BARC data, hard mask data, process result data, model data, historical data, and metrology data for the wafer.

A Soft Mask Iso/nested Control Strategy is determined for the wafer using the wafer state and/or the input data. When a Soft Mask Iso/nested control strategy is executed, a wafer can be processed in a physical module. Alternately, when the controller determines that a Soft Mask Iso/nested control strategy that matches the processing context for a wafer does not exist, the controller can create and can execute a new Soft Mask Iso/nested control strategy.

The control strategy selection and initiation can be context-based. Context matching can be implemented using SQL (Structured Query Language) statements that match all recipes that contain the context items. Alternately, SQL is not required.

In 415, the isolated data can be determined. Isolated data can be CD data that was previously measured and/or calculated for one or more isolated structures on the wafer. When isolated data is required, a wafer can be sent to an integrated metrology module (IMM) to be measured. An Iso-CD value for the wafer can be computed using data from one or more locations on the wafer. For example, the Iso-CD value can be an average value, a 1-Sigma value, or a 3-Sigma value. The metrology data can include reference and/or measured metrology data for at least one isolated structure on the wafer.

In 420, the nested data can be determined. Nested data can be CD data that was previously measured and/or calculated for one or more nested structures on the wafer. When nested data is required, a wafer can be sent to an integrated metrology module (IMM) to be measured. A Nested-CD value for the wafer can be computed using data from one or more locations on the wafer. For example, the Nested-CD value can be an average value, a 1-Sigma value, or a 3-Sigma value. The metrology data can include reference and/or measured metrology data for at least one nested structure on the wafer.

In 425, a query is performed to determine if the Nested-CD value is less than the Iso-CD value. When the Nested-CD value is less than the Iso-CD value, procedure 400 branches to 430 and continues as shown in FIG. 4. When the Nested-CD value is not less than the Iso-CD value, procedure 400 branches to 440 and continues as shown in FIG. 4.

In 430, the control plans associated with an Iso-Greater Control Strategy in which the Iso-CD value is greater than or equal to the Nested-CD value can be executed. The control plans can include at least one of an Iso/nested control plan for controlling an iso/nested process, a Trim Control plan for controlling a trimming process, and a BARC open control plan for controlling a BARC etching process. When the Iso-CD value is equal to the Nested-CD value, or when the required trim amount is substantially equal to zero, or when BARC etching is not required, a null recipe can be sent to the processing tool. Alternately, a recipe may not be sent to the processing tool.

The iso/nested process can include an etching process when the Iso-CD value is greater than the Nested-CD value. For example, an iso/nested etching process can be run using a chamber pressure approximately equal to 10 mT, an upper RF power approximately equal to 200 W, an lower RF power approximately equal to 0 W; an $O_2$ flow rate approximately equal to 70 sccm, the back side He pressure can be approximately equal to 3 Torr in the center region, the back side He pressure can be approximately equal to 3 Torr in the edge region, the top plate temperature can be approximately equal to 80° C., the chamber wall temperature can be approximately equal to 60° C., the substrate holder temperature can be approximately equal to 30° C., and the processing time can be approximately equal to 36 sec. In addition, the CD change for a nested feature was measured to be approximately equal to −23 nm, and the CD change for isolated feature was measured to be approximately equal to −33 nm.

Figure 5A:
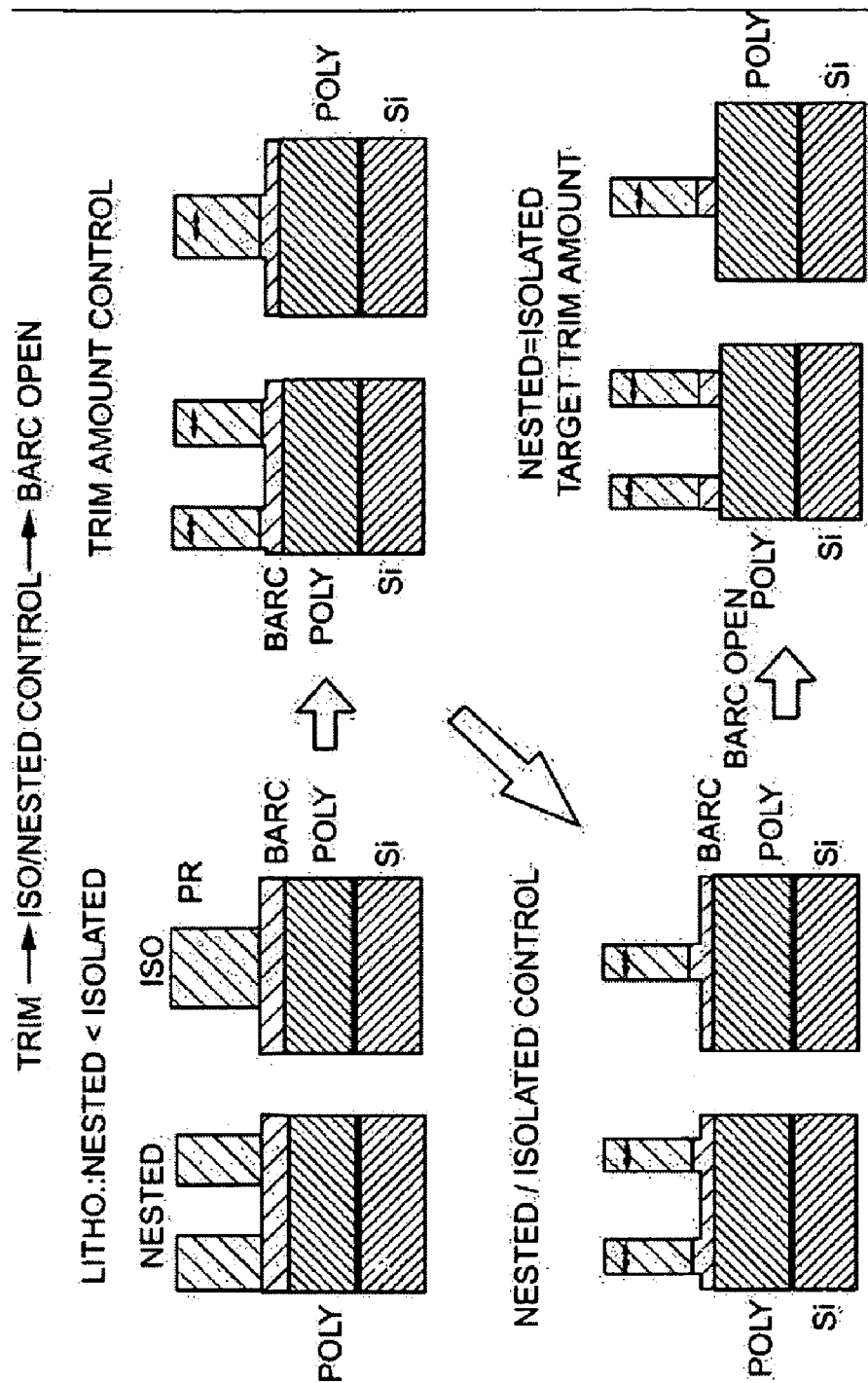
FIG. 5A shows a simplified block diagram of a processing system in accordance with an embodiment of the invention.

In one embodiment shown in FIG. 5A, the isolated soft mask (photoresist) feature size can be larger than the nested soft mask (photoresist) feature size, and a first Iso-Greater Control Strategy requires that the trim process be executed first, the iso/nested etching process be executed second, and the BARC open etching process be executed last.

A trim process can be performed first in which substantially the same amount is trimmed (laterally etched) from the isolated soft mask features and the nested soft mask features. After the trim process is performed, the isolated soft mask feature size remains larger than the nested soft mask feature size. During a trim process, a hard mask (BARC) layer can be partially etched.

Next, an iso/nested etching process can be performed in which unequal amounts are trimmed (laterally etched) from the isolated soft mask features and the nested soft mask features. After the iso/nested etching process is performed, the isolated soft mask features are substantially the same size as the nested soft mask features. During an iso/nested etching process, a hard mask (BARC) layer can be partially etched.

Finally, a BARC open etching process can be performed in which the remaining BARC is removed between the isolated soft mask features and the nested soft mask features. After the BARC open etching process is performed, the isolated soft mask features are substantially the same size as the nested soft mask features. In addition, the isolated hard mask features are substantially the same size as the nested hard mask features after the BARC open etching process is performed. After the BARC open etching process is performed, the size of the isolated hard mask features and the nested hard mask features is substantially equal to the required CD.

Figure 5B:
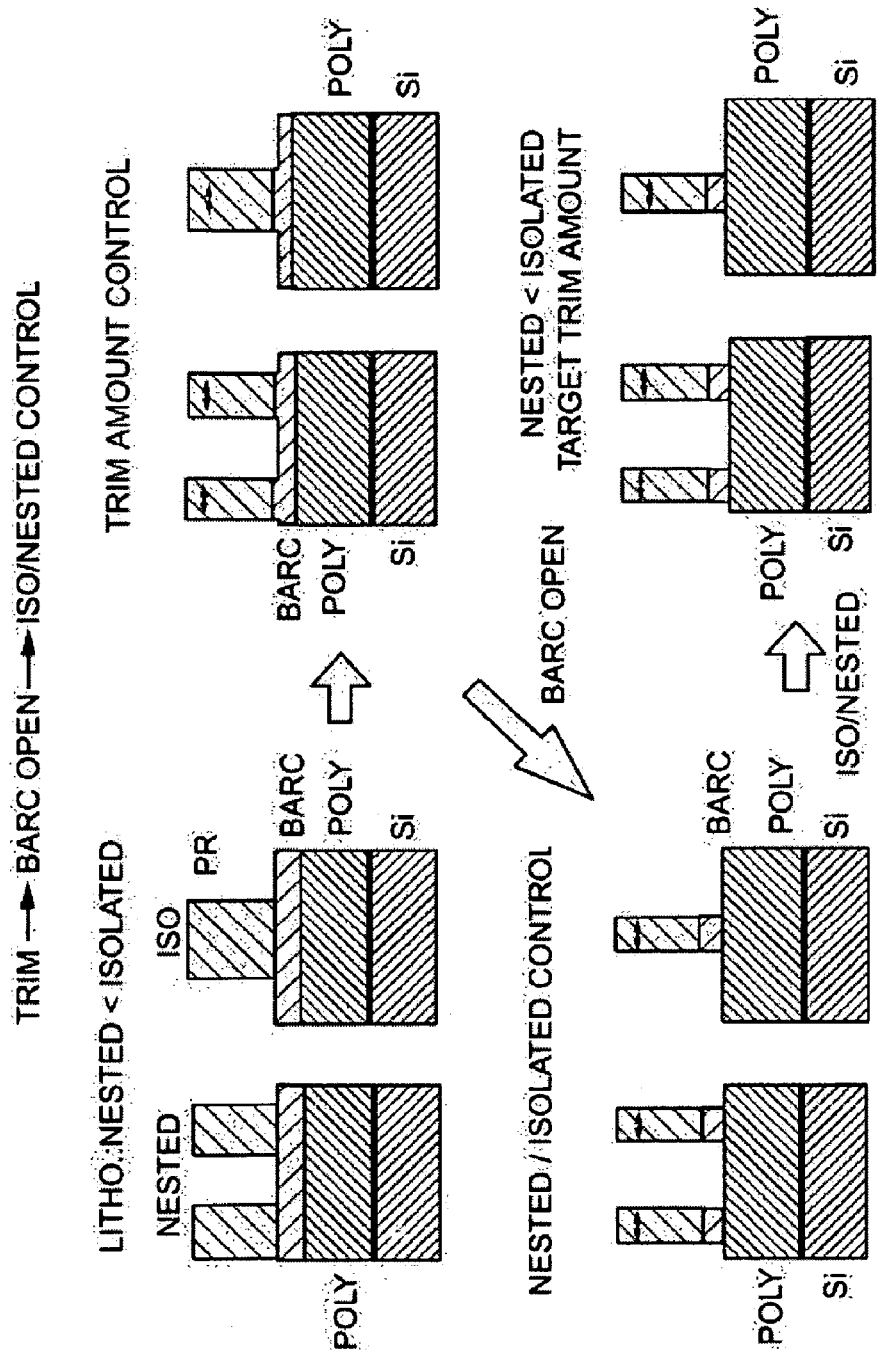
FIG. 5B shows a simplified diagram of a processing system in accordance with an embodiment of the invention.

In a second embodiment shown in FIG. 5B, the isolated soft mask (photoresist) feature size can be larger than the nested soft mask (photoresist) feature size, and the second Iso-Greater Control Strategy requires that the trim process be executed first, the BARC open etching process be executed second, and the iso/nested etching process be executed last.

A trim process can be performed first in which substantially the same amount is trimmed (laterally etched) from the isolated soft mask features and the nested soft mask features. After the trim process is performed, the isolated soft mask feature size remains larger than the nested soft mask feature size. During a trim process, a hard mask (BARC) layer can be partially etched.

Next, a BARC open etching process can be performed in which the remaining BARC is removed forming isolated hard mask features and nested hard mask features. After the BARC open etching process is performed, the isolated soft mask features remain larger in size than the nested soft mask features. In addition, the hard mask features are substantially the same size as the soft mask features after the BARC open etching process is performed.

Finally, an iso/nested etching process can be performed in which unequal amounts are trimmed (laterally etched) from the isolated soft mask features and the nested soft mask features. In addition, during an iso/nested etching process, unequal amounts are trimmed from the isolated hard mask features and the nested hard mask features. After the iso/nested etching process is performed, the isolated soft mask features are substantially the same size as the nested soft mask features. During an iso/nested etching process, a hard mask (BARC) layer can be partially etched. After the iso/nested etching process is performed, the size of the isolated hard mask features and the nested hard mask features is substantially equal to the required CD.

Figure 5C:
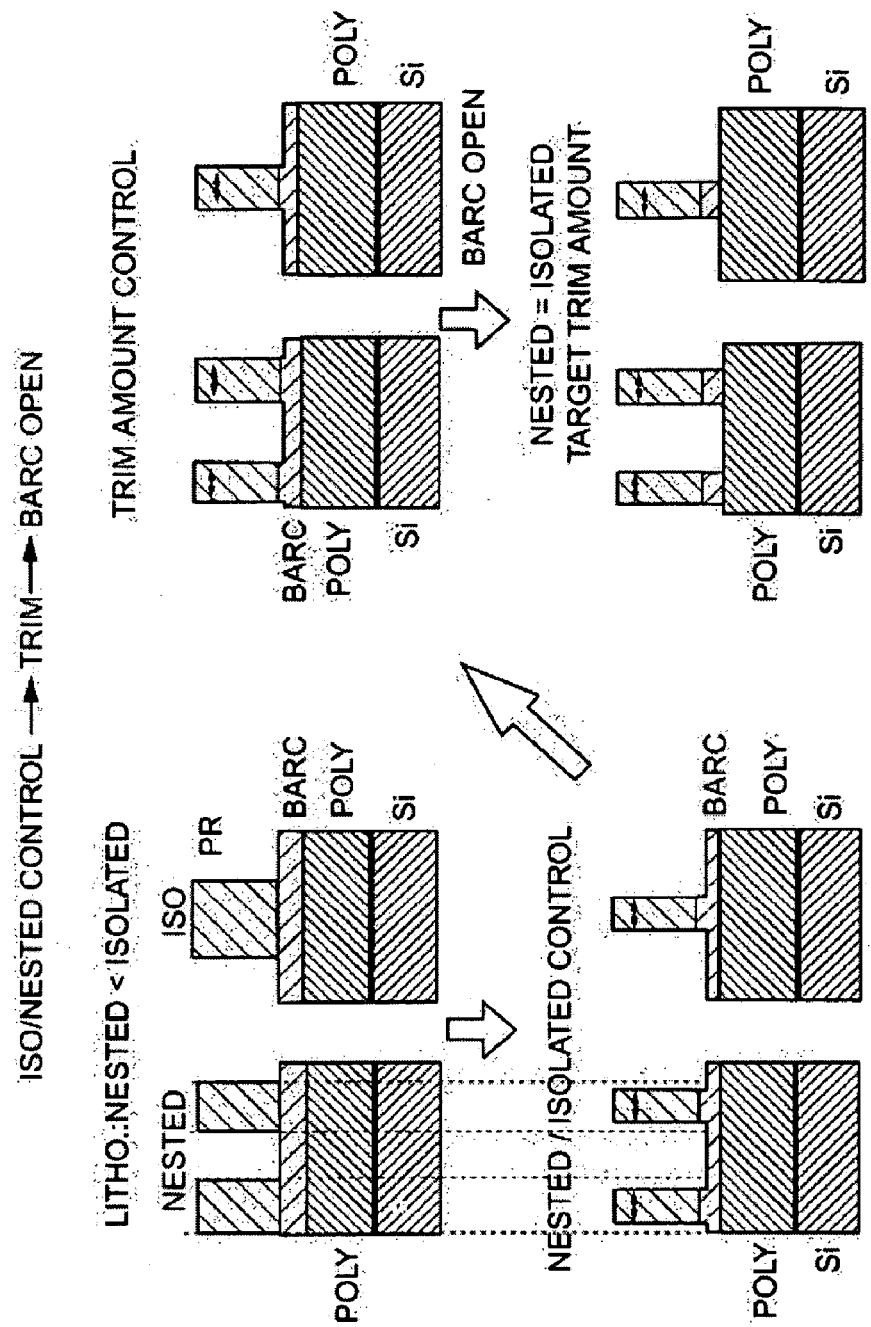
FIG. 5C shows a simplified diagram of another processing system in accordance with an embodiment of the invention.

In a third embodiment shown in FIG. 5C, the isolated soft mask (photoresist) feature size can be larger than the nested soft mask (photoresist) feature size, and a third Iso-Greater Control Strategy can require that the iso/nested etching process be executed process be executed first, the trim process be executed second, and the BARC open etching process be executed last.

An iso/nested etching process can be performed first in which unequal amounts are trimmed (laterally etched) from the isolated soft mask features and the nested soft mask features. After the iso/nested etching process is performed, the isolated soft mask features are substantially the same size as the nested soft mask features. During an iso/nested etching process, a hard mask (BARC) layer can be partially etched.

Next, a trim process can be performed in which substantially the same amount is trimmed (laterally etched) from the isolated soft mask features and the nested soft mask features. After the trim process is performed, the size of the isolated soft mask features remains substantially the same as the size of the nested soft mask features. During a trim process, a hard mask (BARC) layer can be partially etched.

Finally, a BARC open etching process can be performed in which the remaining BARC is removed between the isolated soft mask features and the nested soft mask features. After the BARC open etching process is performed, the isolated soft mask features are substantially the same size as the nested soft mask features. In addition, the isolated hard mask features are substantially the same size as the nested hard mask features after the BARC open etching process is performed. After the BARC open etching process is performed, the size of the isolated hard mask features and the nested hard mask features is substantially equal to the required CD.

Figure 5D:
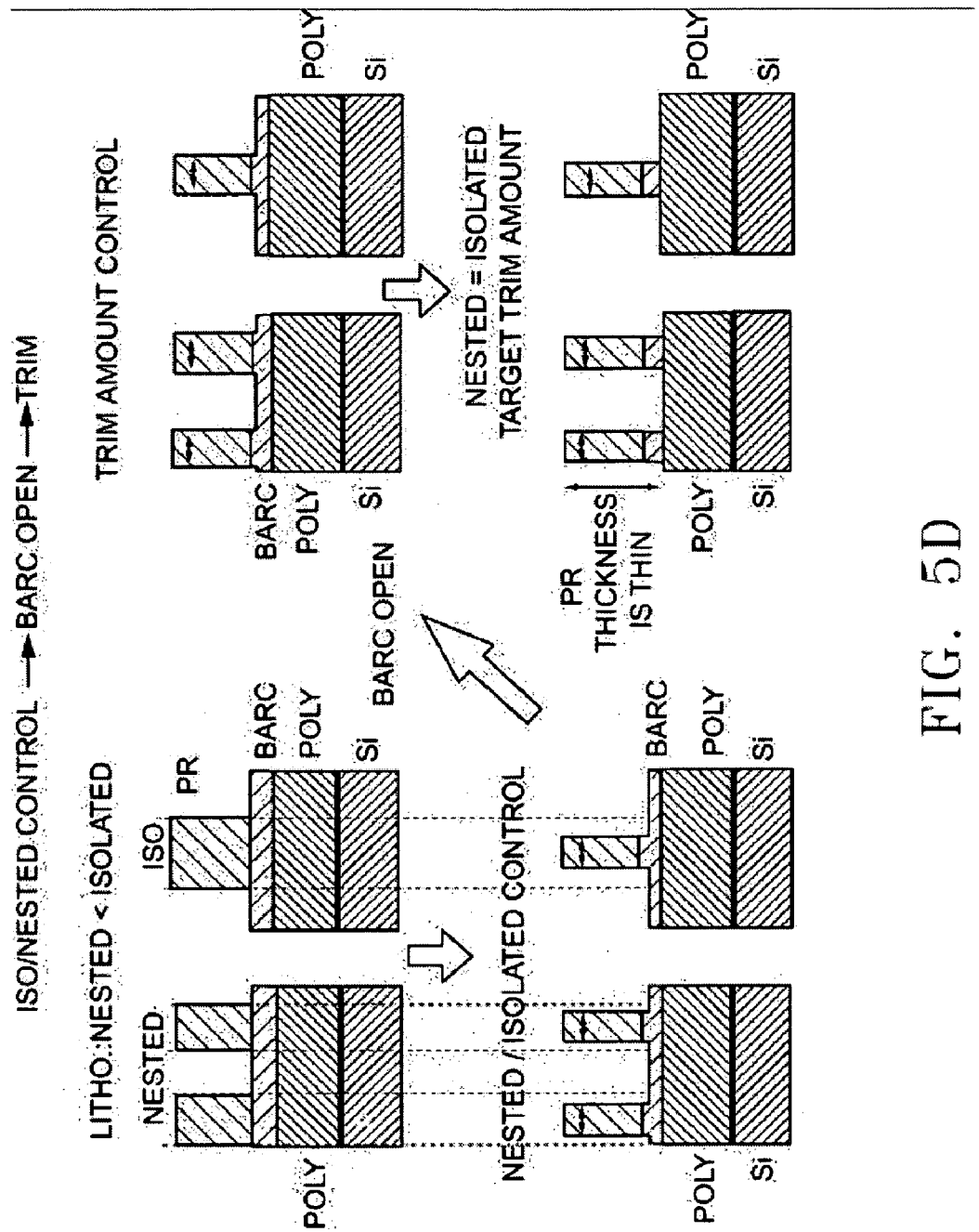
FIG. 5D shows a simplified diagram of yet another processing system in accordance with an embodiment of the invention.

In a fourth embodiment shown in FIG. 5D, the isolated soft mask (photoresist) feature size can be larger than the nested soft mask (photoresist) feature size, and a fourth Iso-Greater Control Strategy can require that the iso/nested etching process be executed process be executed first, the BARC open etching process be executed second, and the trim process be executed last.

An iso/nested etching process can be performed first in which unequal amounts are trimmed (laterally etched) from the isolated soft mask features and the nested soft mask features. After the iso/nested etching process is performed, the isolated soft mask features are substantially the same size as the nested soft mask features. During an iso/nested etching process, a hard mask (BARC) layer can be partially etched.

Next, a BARC open etching process can be performed in which the remaining BARC is removed between the isolated soft mask features and the nested soft mask features. After the BARC open etching process is performed, the isolated soft mask features are substantially the same size as the nested soft mask features. In addition, the isolated hard mask features are substantially the same size as the nested hard mask features after the BARC open etching process is performed.

Finally, a trim process can be performed in which substantially the same amount is trimmed (laterally etched) from the isolated soft mask features and the nested soft mask features. In addition, during the trim process, substantially the same amount is trimmed from the isolated hard mask features and the nested hard mask features. After the trim process is performed, the size of the isolated hard mask features and the nested hard mask features is substantially equal to the required CD. After the trim process, the size of the soft mask features can be equal to or less than the size of the hard mask features.

Again referring to FIG. 4, in 430, data collection (DC) plans associated with the Iso-Greater Control Strategy can be executed. Data collection plan applications can run before, during, and/or after control plans are executed. Data collection plans can obtain data from processing elements such as a tool, a module, a chamber, and a sensor; measuring elements such as a OES system, ODP system, a SEM system, a TEM system, and a MES system. In addition, the data collection plan selection and initiation can also be context-based. The DC plan determines which data is collected, how the data is collected, and where the data is stored. The controller 120 can auto-generate data collection plans for physical modules. Typically, one data collection plan can be active at a time for a specific module, and the controller 120 can select and use a data collection plan that matches the wafer context. Data can include trace data, process log information, recipe data, maintenance counter data, ODP data, OES data, VIP data, or analog data, or a combination of two or more thereof. Measurement devices and/or sensors can be started and stopped by a DC plan. A DC plan can also provide information for trimming data, clipping data, and dealing with spike data and outliers.

In 435, an Iso-Greater Analysis Strategy is determined for the wafer using the wafer data. When an analysis strategy is executed, wafer data, process data, and/or module data can be analyzed, and alarm/fault conditions can be identified.

In addition, the analysis plans associated with the Iso-Greater Analysis Strategy can be executed. The analysis plans can include at least one of a Trim Control analysis plan for analyzing a trimming process, an iso/nested analysis plan for analyzing an iso/nested etching process, and a BARC open analysis plan for analyzing a BARC etching process. In addition, judgment and/or intervention plans can be executed.

For example, after the data has been collected, the data can be sent to a judgment and/or intervention plan for run-rule evaluation. Fault limits can be calculated automatically based on historical data or entered manually based on the customer's experience or process knowledge, or obtained from a host computer. The data can be compared with the warning and control limits, and when a run-rule is violated, an alarm can be generated, indicating the process has exceeded statistical limits. When an alarm is generated, the controller 120 can perform either notification or intervention. Notification can be via e-mail or by an e-mail activated pager. In addition, the controller 120 can perform an intervention: either pausing the process at the end of the current lot, or pausing the process at the end of the current wafer. The controller 120 can identify the processing module that caused the alarm to be generated.

Results from analysis plans, judgment plans, and intervention plans can feed forward and/or feedback data to other plans, and the other plans can use this data to calculate their outputs.

After procedure 435 is performed, procedure 400 can continue to 450 where it ends.

In 440, the control plans associated with a Nes-Greater Control Strategy in which the Iso-CD value is less than the Nested-CD value can be executed. The control plans can include at least one of an Iso/nested control plan for controlling an iso/nested etching process, a Trim Control plan for controlling a trimming process, and a BARC open control plan for controlling a BARC etching process.

The iso/nested process can include a deposition process when the Nested-CD value is greater than the Iso-CD value. For example, an iso/nested deposition process can be run using a chamber pressure approximately equal to 10 mT, an upper RF power approximately equal to 200 W, an lower RF power approximately equal to 100 W; a $CHF_3$ flow rate approximately equal to 200 sccm, the back side He pressure can be approximately equal to 3 Torr in the center region, the back side He pressure can be approximately equal to 3 Torr in the edge region, the top plate temperature can be approximately equal to 80° C., the chamber wall temperature can be approximately equal to 60° C., the substrate holder temperature can be approximately equal to 30° C., and the processing time can be approximately equal to 185 sec. In addition, the CD change for a nested feature was measured to be approximately equal to +15 nm, and the CD change for isolated feature was measured to be approximately equal to +30 nm.

Figure 6A:
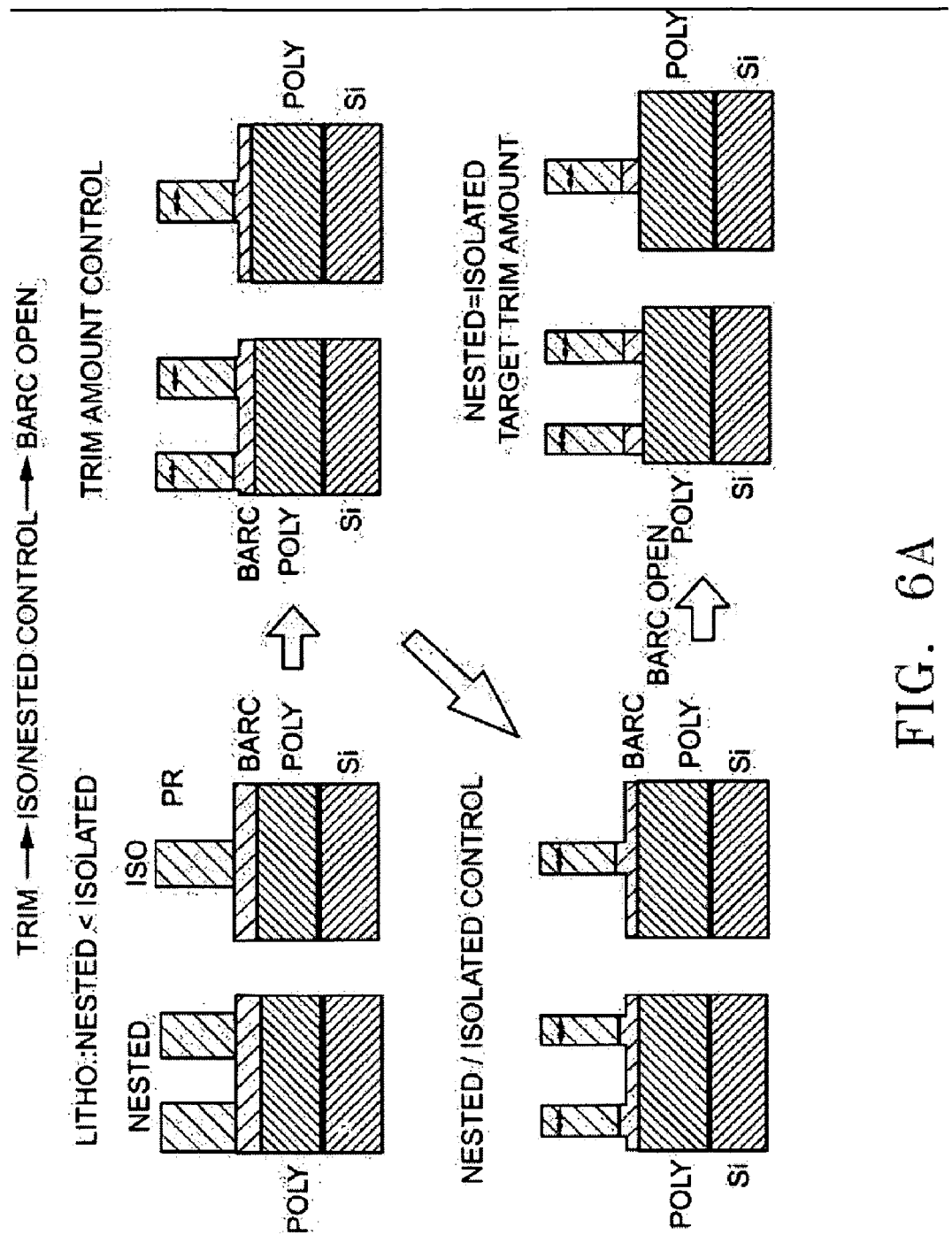
FIG. 6A shows a simplified diagram of a further processing system in accordance with an embodiment of the invention.

In a fifth embodiment shown in FIG. 6A, the nested soft mask (photoresist) feature size can be greater than the isolated soft mask (photoresist) feature size, and a first Nes-Greater Control Strategy requires that the trim process be executed first, an iso/nested deposition process be executed second, and the BARC open etching process be executed last.

A trim process can be performed first in which substantially the same amount is trimmed (laterally etched) from the isolated soft mask features and the nested soft mask features. After the trim process is performed, the isolated soft mask feature size remains larger than the nested soft mask feature size. During a trim process, a hard mask (BARC) layer can be partially etched.

Next, an iso/nested deposition process can be performed in which unequal amounts are deposited to the isolated soft mask features and the nested soft mask features. During the iso/nested deposition process, the deposition rate can be larger on the isolated features and after the deposition process is performed the isolated soft mask (photoresist) feature size can be greater than or substantially equal to the nested soft mask (photoresist) feature size. During an iso/nested deposition process, a hard mask (BARC) layer can be partially coated.

Finally, a BARC open etching process can be performed in which the remaining BARC is removed between the isolated soft mask features and the nested soft mask features. After the BARC open etching process is performed, the isolated soft mask features are substantially the same size as the nested soft mask features. In addition, the isolated hard mask features are substantially the same size as the nested hard mask features after the BARC open etching process is performed. After the BARC open etching process is performed, the size of the isolated hard mask features and the nested hard mask features is substantially equal to the required CD.

Figure 6B:
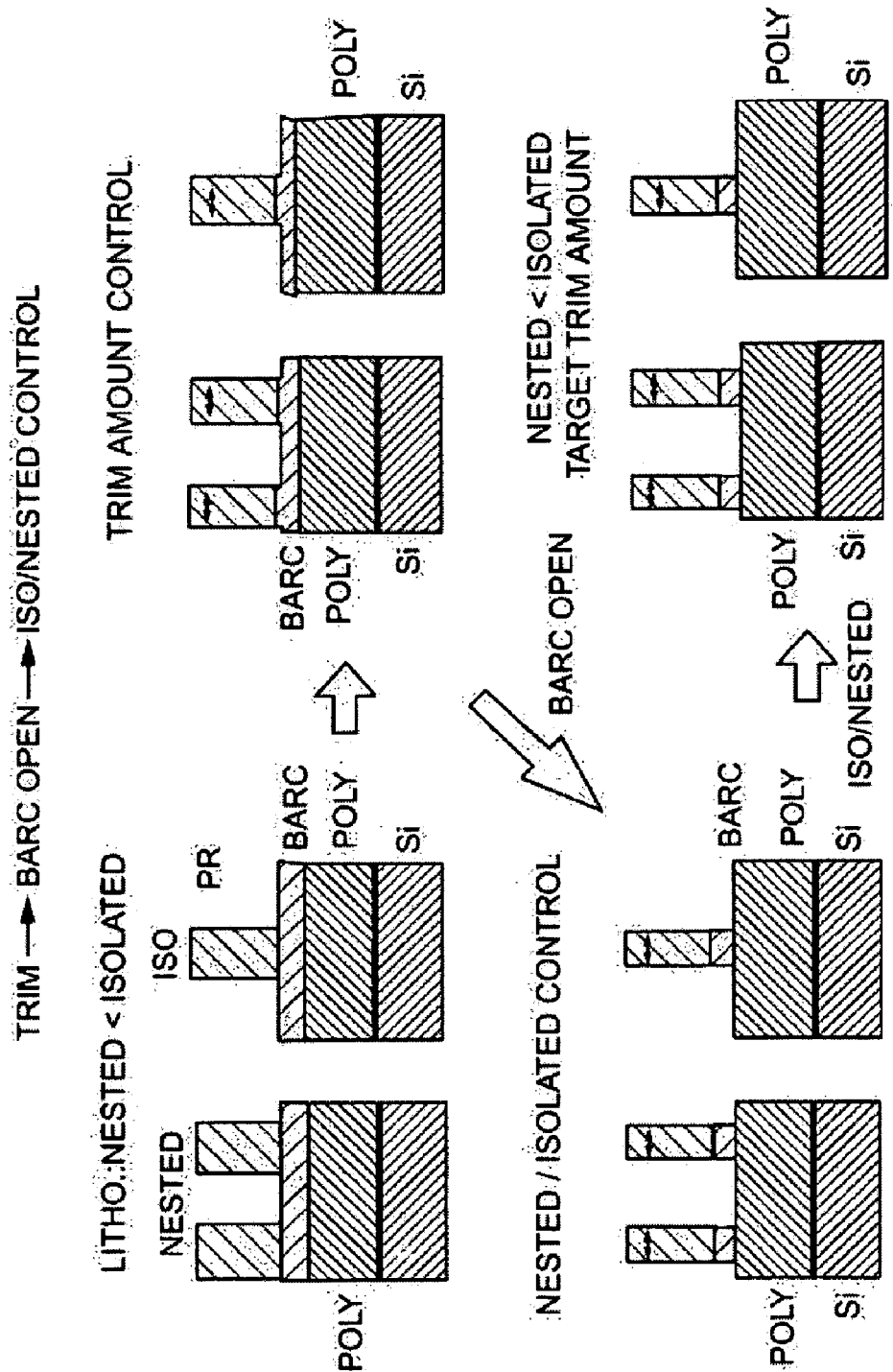
FIG. 6B shows a simplified diagram of one additional processing system in accordance with an embodiment of the invention.

In a sixth embodiment shown in FIG. 6B, the nested soft mask (photoresist) feature size can be greater than the isolated soft mask (photoresist) feature size, and a second Nes-Greater Control Strategy requires that the trim process be executed first, the BARC open etching process be executed second, and the iso/nested deposition process be executed last.

A trim process can be performed first in which substantially the same amount is trimmed (laterally etched) from the isolated soft mask features and the nested soft mask features. After the trim process is performed, the isolated soft mask feature size remains larger than the nested soft mask feature size. During a trim process, a hard mask (BARC) layer can be partially etched.

Next, a BARC open etching process can be performed in which the remaining BARC is removed forming isolated hard mask features and nested hard mask features. After the BARC open etching process is performed, the isolated soft mask features remain larger in size than the nested soft mask features. In addition, the hard mask features are substantially the same size as the soft mask features after the BARC open etching process is performed.

Finally, an iso/nested deposition process can be performed in which unequal amounts are deposited to the isolated soft mask features and the nested soft mask features. During the iso/nested deposition process, the deposition rate can be larger on the isolated features and after the deposition process is performed, the isolated soft mask (photoresist) feature size can be greater than or substantially equal to the nested soft mask (photoresist) feature size. During an iso/nested deposition process, a hard mask (BARC) layer can be partially coated.

Figure 6C:
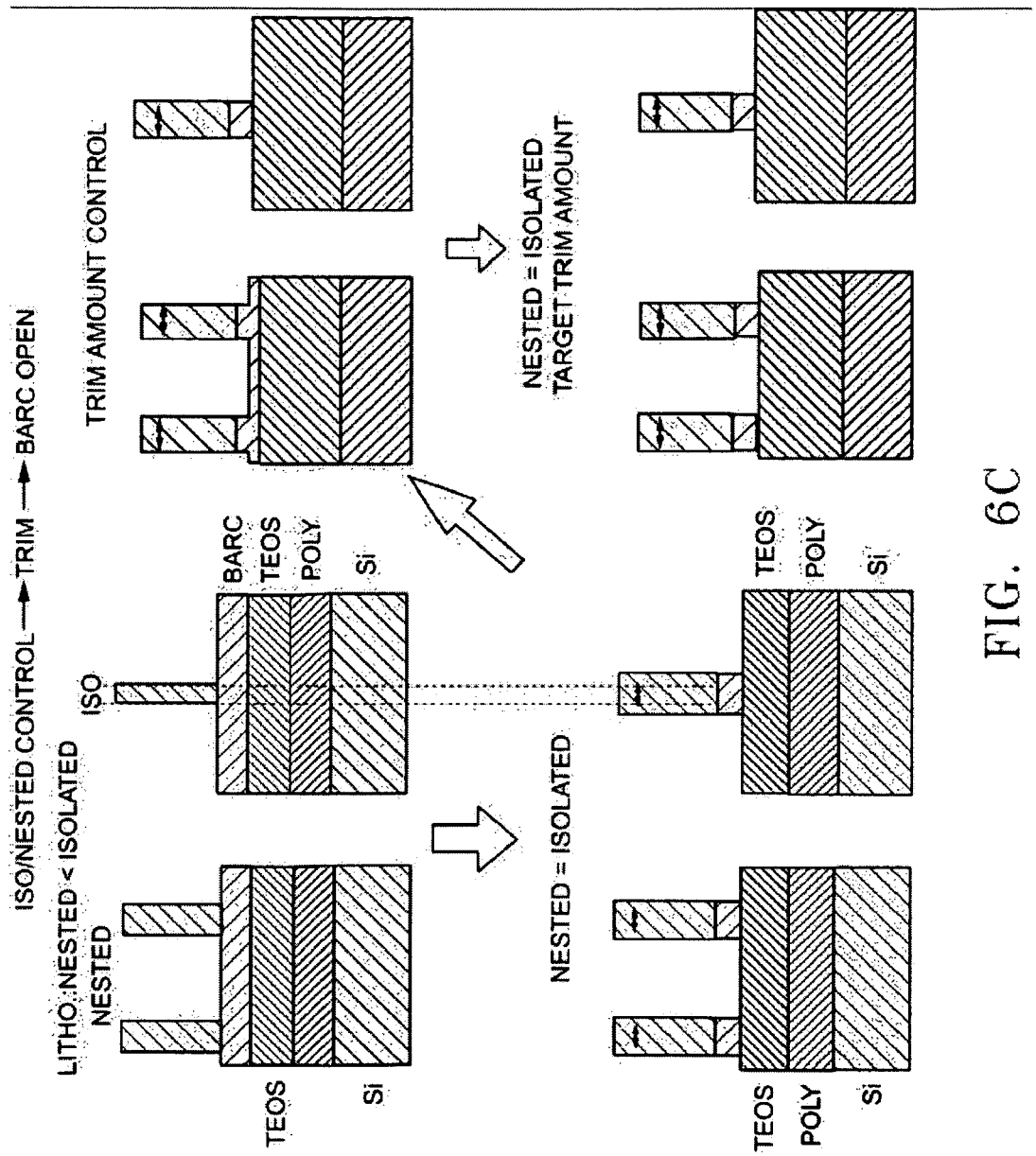
FIG. 6C shows a simplified diagram of another processing system in accordance with an embodiment of the invention.

In a seventh embodiment shown in FIG. 6C, the nested soft mask (photoresist) feature size can be greater than the isolated soft mask (photoresist) feature size, and a third Nes-Greater Control Strategy can require that the iso/nested deposition process be executed process be executed first, the trim process be executed second, and the BARC open etching process be executed last.

First, an iso/nested deposition process can be performed in which unequal amounts are deposited to the isolated soft mask features and the nested soft mask features. During the iso/nested deposition process, the deposition rate can be larger on the isolated features and after the deposition process is performed, the isolated soft mask (photoresist) feature size can be greater than or substantially equal to the nested soft mask (photoresist) feature size. During an iso/nested deposition process, a hard mask (BARC) layer can be partially coated.

Next, a trim process can be performed in which substantially the same amount is trimmed (laterally etched) from the isolated soft mask features and the nested soft mask features. After the trim process is performed, the size of the isolated soft mask features remains substantially the same as the size of the nested soft mask features. During a trim process, a hard mask (BARC) layer can be partially etched.

Finally, a BARC open etching process can be performed in which the remaining BARC is removed between the isolated soft mask features and the nested soft mask features. After the BARC open etching process is performed, the isolated soft mask features are substantially the same size as the nested soft mask features. In addition, the isolated hard mask features are substantially the same size as the nested hard mask features after the BARC open etching process is performed. After the BARC open etching process is performed, the size of the isolated hard mask features and the nested hard mask features is substantially equal to the required CD.

Figure 6D:
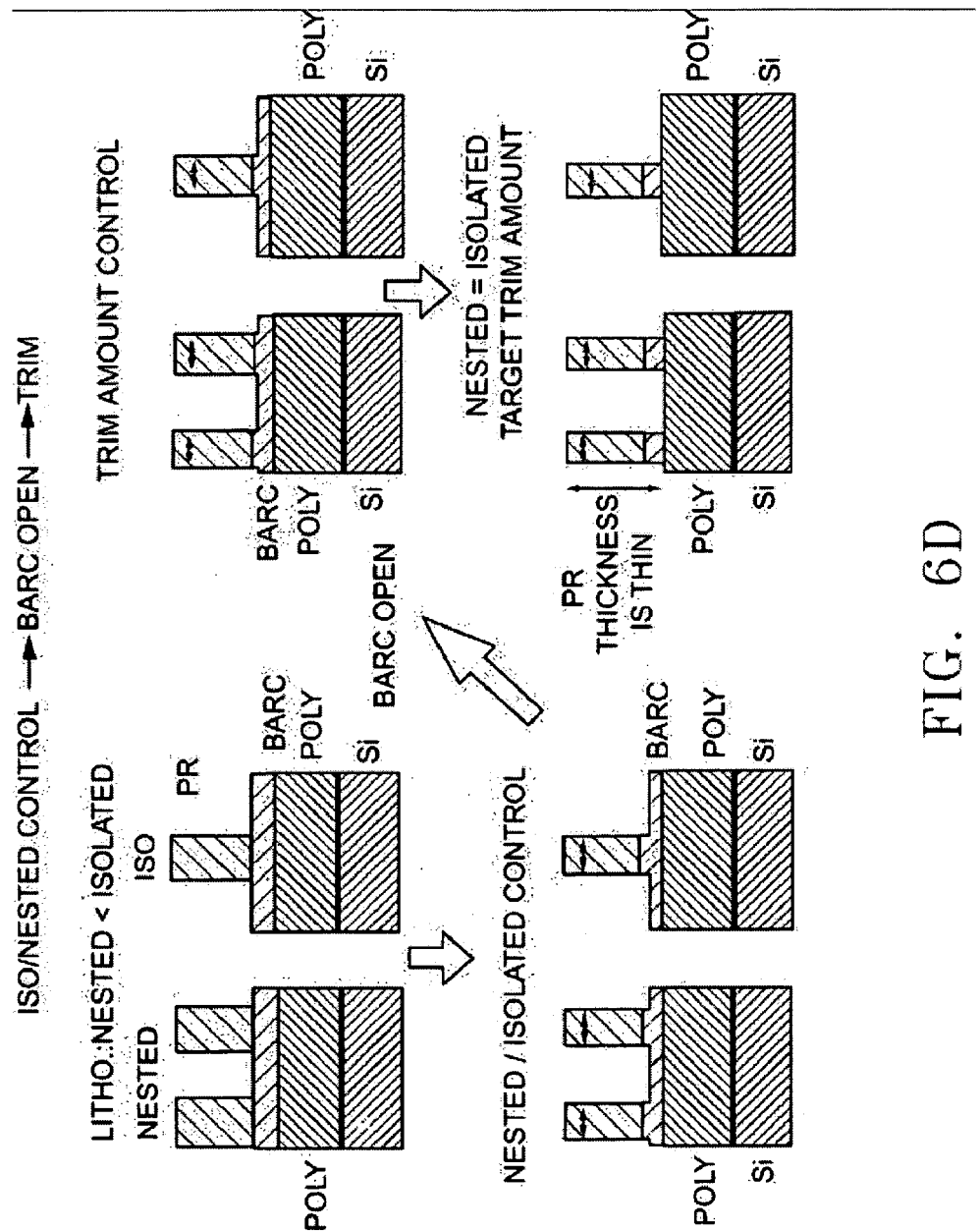
FIG. 6D shows a simplified diagram of one further processing system in accordance with an embodiment of the invention.

In an eighth embodiment shown in FIG. 6D, the nested soft mask (photoresist) feature size can be larger than the isolated soft mask (photoresist) feature size, and a fourth Nes-Greater Control Strategy can require that the iso/nested deposition process be executed process be executed first, the BARC open etching process be executed second, and the trim process be executed last.

First, an iso/nested deposition process can be performed in which unequal amounts are deposited to the isolated soft mask features and the nested soft mask features. During the iso/nested deposition process, the deposition rate can be larger on the isolated features and after the deposition process is performed, the isolated soft mask (photoresist) feature size can be greater than or substantially equal to the nested soft mask (photoresist) feature size. During an iso/nested deposition process, a hard mask (BARC) layer can be partially coated.

Next, a BARC open etching process can be performed in which the remaining BARC is removed between the isolated soft mask features and the nested soft mask features. After the BARC open etching process is performed, the isolated soft mask features are substantially the same size as the nested soft mask features. In addition, the isolated hard mask features are substantially the same size as the nested hard mask features after the BARC open etching process is performed.

Finally, a trim process can be performed in which substantially the same amount is trimmed (laterally etched) from the isolated soft mask features and the nested soft mask features. In addition, during the trim process, substantially the same amount is trimmed from the isolated hard mask features and the nested hard mask features. After the trim process is performed, the size of the isolated hard mask features and the nested hard mask features is substantially equal to the required CD. After the trim process, the size of the soft mask features can be equal to or less than the size of the hard mask features.

Again referring to FIG. 4, in 440, data collection (DC) plans associated with the Nes-Greater Control Strategy can be executed. Data collection plan applications can run before, during, and/or after control plans are executed. In addition, the data collection plan selection and initiation can also be context-based. The DC plan determines which data is collected, how the data is collected, and where the data is stored. The controller 120 can auto-generate data collection plans for physical modules. Typically, one data collection plan can be active at a time for a specific module, and the controller 120 can select and use a data collection plan that matches the wafer context. Data can include trace data, process log information, recipe data, maintenance counter data, ODP data, OES data, VIP data, or analog data, or a combination of two or more thereof. Measurement devices and/or sensors can be started and stopped by a DC plan. A DC plan can also provide information for trimming data, clipping data, and dealing with spike data and outliers.

In 445, a Nes-Greater Analysis Strategy is determined for the wafer using the wafer data. When an analysis strategy is executed, wafer data, process data, and/or module data can be analyzed, and alarm/fault conditions can be identified.

In addition, the analysis plans associated with the Nes-Greater Analysis Strategy can be executed. The analysis plans can include at least one of a Trim Control analysis plan for analyzing a trimming process, an iso/nested analysis plan for analyzing an iso/nested etching process, and a BARC open analysis plan for analyzing a BARC etching process. In addition, judgment and/or intervention plans can be executed.

For example, after the data has been collected, the data can be sent to a judgment and/or intervention plan for run-rule evaluation. Fault limits can be calculated automatically based on historical data or entered manually based on the customer's experience or process knowledge, or obtained from a host computer. The data can be compared with the warning and control limits, and when a run-rule is violated, an alarm can be generated, indicating the process has exceeded statistical limits. When an alarm is generated, the controller 120 can perform either notification or intervention. Notification can be via e-mail or by an e-mail activated pager. In addition, the controller 120 can perform an intervention: either pausing the process at the end of the current lot, or pausing the process at the end of the current wafer. The controller 120 can identify the processing module that caused the alarm to be generated.

Results from analysis plans, judgment plans, and intervention plans can feed forward and/or feedback data to other plans, and the other plans can use this data to calculate their outputs.

After procedure 445 is performed, procedure 400 can continue to 450 where it ends. The wafer can be removed from the processing chamber by a transfer system. One or more of the processed wafers can be sent to a measurement tool such as an ODP tool.

In the illustrated embodiment, a single control strategy is shown, but this is not required for the invention. One or more control strategies can be created for each measurement step and/or processing step in a process sequence.

A control plan can be coupled to one or more other control plans and one or more input data items. Results from control plans and data collection plans can feed forward and/or feedback data to other plans, and the other plans can use this data to calculate their outputs.

Control plans can receive measurement data. The measurement data can include "Isolated" data that can include metrology data for at least one area on the wafer that comprises isolated structures, features, trenches, or vias, or combinations thereof, and can include "Nested" data that can include metrology data for at least one area on the wafer that comprises dense and/or nested structures, features, trenches, or vias, or combinations thereof. Alternately, other data can be included such as a "Reference", "Mixed", or "Nominal" data.

The input data can comprise Optical Digital Profilometry (ODP) data from an integrated metrology module (IMM), such as an iODP module from Tokyo Electron Ltd. Alternately, the input data may include SEM data and/or TEM data.

Control plans can include data conversion operations. For example, data conversion can be used to calibrate the "Isolated" data to "CD-SEM" data. An equation and/or table can be established that relates the metrology data for "isolated" structures from one metrology module (IMM) to another metrology module (SEM). In addition, data conversion can be used to calibrate the "Nested" data to "CD-SEM" data. An equation and/or table can be established that relates the metrology data for "nested" structures from one metrology module (IMM) to another metrology module (SEM). One metrology module may be used to provide "Reference" data.

Control plans can be used to compute one or more recipe parameters, and the control plan outputs can include one or more recipe parameters for one or more process steps. For example, step time may be a computed recipe parameter.

A physical module can have at least one control plan defined for each visit to the physical module. Control plans contain models, limits, targets, recipes, and can cover multiple process steps within a module. In one embodiment, a Soft Mask Iso/nested Control Strategy and/or plan can be established and mapped to a physical module. Control strategies and/or plans can be established when a Process Job (PJ) is received and/or created.

In one embodiment, the procedure shown in FIG. 4 can be performed in a single processing chamber such as a TELIUS SCCM Poly Chamber from Tokyo Electron Limited (TEL). In alternate embodiments, one or more chambers can be used. A single chamber procedure provides a lower cost approach for gate stack etching processes.

FIG. 7 shows an exemplary recipe table in accordance with an embodiment of the invention. In the illustrated embodiment, the trim amount can be changed by changing, for example, the value of the step time in step 2. In an alternate embodiment, a different parameter can be used to control the trim amount.

In addition, the gas chemistry can be changed to control the iso/nested offset value.

Figure 8:
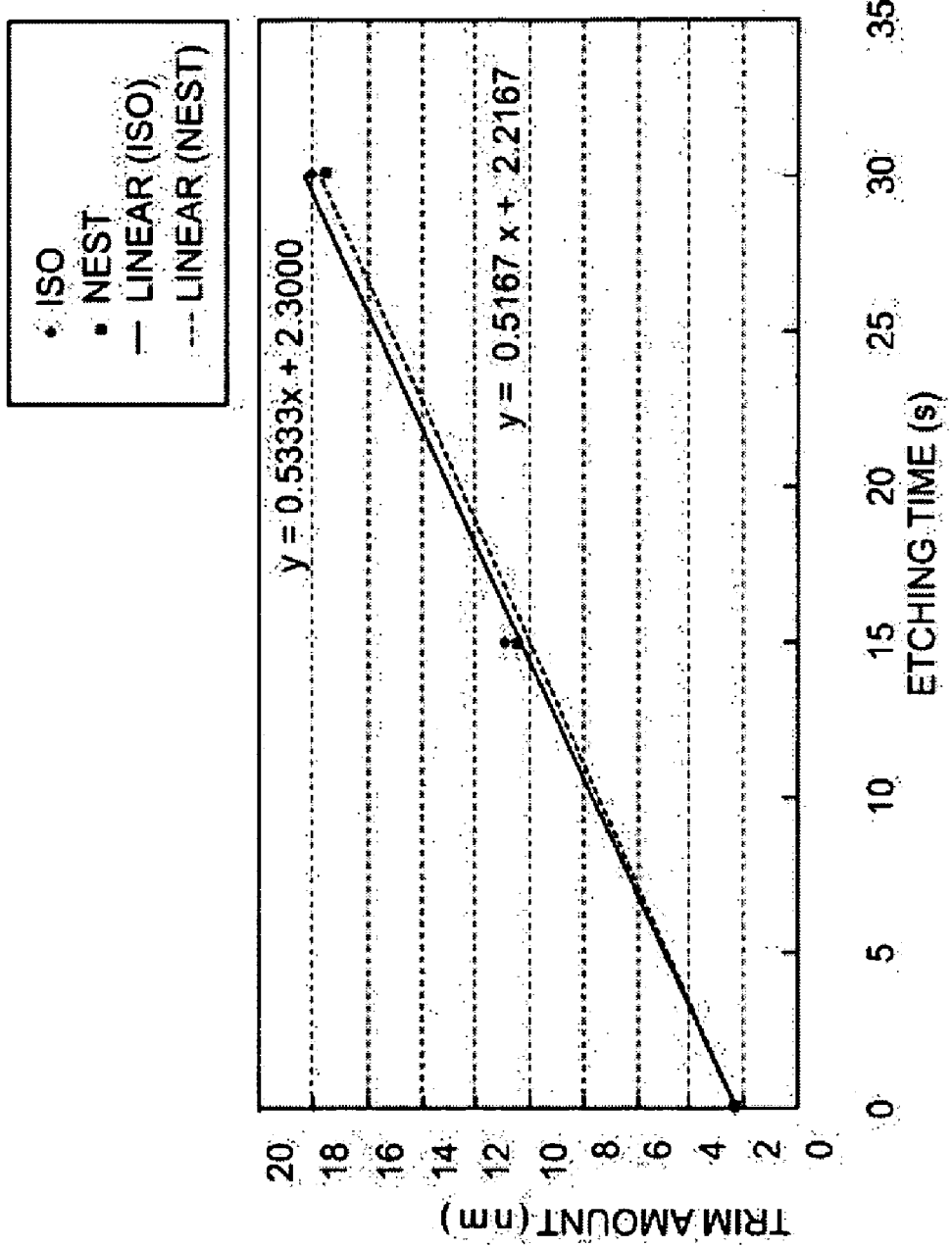
FIG. 8 shows a graph of exemplary trim equations in accordance with an embodiment of the invention.

FIG. 8 shows a graph of exemplary trim equations in accordance with an embodiment of the invention. In the illustrated embodiment, linear equations are shown for an Iso trim amount and a Nest trim amount. Alternately, non-linear equations can be used. In FIG. 8, the graph shows a Trim amount vs. Etching time after a BARC open process has been performed.

In one case, the isolated structures etch faster than the Nested structures. Alternately, other rates can be used. In addition, the Isolated CDs can be larger than the Nested CDs. Alternately, other relationships can be made. In addition, the variation within the nested CDs can be greater.

In one part of the procedure, an iso-nested bias can be calculated. For example, the ODP data for each structure can be correlated to reference data, such as CD-SEM data.

In one example in which the nested feature size is less than the isolated feature size, the iso-nested delta can be calculated and the ODP data can be calibrated to CD-SEM data.

In one embodiment, an measurement grating having a first pitch is provided that is consistent with the isolated structures/features for a particular product and technology and another measurement grating having a second pitch is provided that is consistent with the nested structures/features for this product and technology. For example, a 595 nm grating can be used for isolated structures and a 245 nm grating can be used for nested structures. In alternate embodiments, additional measurement gratings may be provided and different pitches may be provided.

The calculated isolated data value can be determined using:

$$Iso_c = Iso\_Mandel\_Slope * Iso\_ODP + Iso\_Mandel\_Intercept$$

$$Iso_c = (1.08 * d1 + 12.27)$$

where Iso_Mandel_Slope is the slope of the line relating the CDSEM data to the ODP data for isolated structures, Iso_ODP is the value of one of the ODP measurements for one of the isolated structures; Iso_Mandel_Intercept is the intercept point of the line relating the CDSEM data to the ODP data for isolated structures.

The calculated nested data value can be determined using:

$$Nested_c = Nested\_Mandel\_Slope * Nested\_ODP + Nested\_Mandel\_Intercept$$

$$Nested_c = (1.08 * d2 + 12.27)$$

where the Nested_Mandel_Slope is the slope of the line relating the CDSEM data to the ODP data for nested structures, the Nested_ODP is the value of one of the ODP measurements for one of the nested structures; and the Nested_Mandel_Intercept is the intercept point of the line relating the CDSEM data to the ODP data for nested structures.

The difference can be $$Delta(nm) = Iso_c - Nested_c$$

In one case, an iso/nested step time adjustment can be calculated.

$$Delta\_Trim(t1) = Delta - Delta\_Target\ (o\ 1)$$

$$Y = t1 = (1.08 * d1 + 12.27) - (1.08 * d2 + 12.27) - o1$$

Recipe Setting=Delta_Trim=$y=f(x)$

Control parameter=Step Process Time (seconds)

$$Delta\_Trim\ (nm) = y = (3.8/15) * x$$

This equation can be solved for x, and this time can be entered in recipe step 4 (StepProcessTime)

Next, the remaining Trim based on the amount of Trim made during the Iso/Nested trim can be calculated.

$$Delta\_Trim = t1 = f(d3)$$

Pass t1 from the first control plan (CP1), and assign t1 to d3. Then, calculate the amount of trim in iso/nested calculations where:

$$Delta\_Trim = (d3 * (18.1/15))$$

Next, the remaining trim needed can be computed.

Trim=Iso$_c$–Target–Delta_Trim Complete $$t1 = (1.08 * d1 + 12.27) - o1 - (d3 * (18.1/15))$$

Trim=$y=f(x)$

Compute "StepProcessTime" as x. For example:

$$y = 0.6(x)$$

Solve for x, enter this time in recipe step 2 (StepProcessTime).

Another way to control a soft mask etch process would be to provide an intermediate pitch between either fully nested or isolated. In this case, the Iso/nest adjustment could be calculated as previously shown. The trim amount needed could be calculated; the CD of a control structure could be determined based on additional measurements; a correlation could be developed between the control pitch and another pitch; the existing measurements could be calibrated to the control pitch; and the trim amount could be calculated using:

Trim amount=CD for control structure−CD target for control structure

Table 1 shows an exemplary set of process parameters for processing a wafer having isolated and nested structures. A three-step process (Iso/Nested Trim, BARC, and TRIM) is shown, but this is not required for the invention. Alternately, a different number of steps may be used and the steps may be performed in a different order.

TABLE 1

| Cond | Press (mt) | Power T/B (W) | Gap (mm) | CF4 sccm | CHF3 sccm | CH2F2 Sccm | O2 sccm | N2 sccm | Ar sccm | H.V. (kV) | BP(C/E) (Torr) | Temp C. T/W/B | Etching Time (Sec) |
|---|---|---|---|---|---|---|---|---|---|---|---|---|---|
| | | Iso/nested Trim step - Recipe A or Recipe B settings - Based on (Iso > Nested or Iso < Nested) | | | | | | | | | | | |
| BARC | 8 | 200/75 | 170 | 55 | | 7.5 | 12 | | | 2.5 | 3/3 | 80/60/75 | 49 |
| TRIM | 7 | 200/75 | 170 | | | | 3 | 50 | | 2.5 | 3/3 | 80/60/75 | 15 |

The Trim variable value can be approximated using the average value for the Iso/Nested etch rate, and the step_time variable value can be passed from another Control plan. Next, the additional trim (remaining BARC Trim) can be determined based on the amount of BARC Trim made during the bias trim process.

For example:

Iso/Nested Trim Amount=(Average Iso Trim Amount/Trim time)*Step_time

Iso/Nested Trim Amount=(18.1/15)*Step_time

Trim=$Iso_o$−Iso/Nested Trim Amount−Final CD Target(Iso)

In an alternate embodiment, the calculations can be based on nested values.

In addition, recipe settings for the final BARC trim can be computed. For example, when using a $O_2/CF_4$ ratio, an equation can be created:

BARC_Trim=$y=f(x)$ where x is $O_2$ flow, and $y=48.416083725*(1-0.00388123723/((0.020654293/80)*x+0.0046147421))$ In some cases, out of range exceptions may occur. For example, the calculated Iso/nested value can be larger than total trim value, or the Iso value can be larger than the nested incoming CD. One solution would be to check the sign and make a set of computations based on the need to grow nested. When the value is off the iso/nested bias trim curve, the maximum bias adjustment may be used. When the value is off the low end of the trim curve, the solution can be to skip the trim, and when the value is off the high end of the trim curve, the solution can be to use max trim and generate warning to host.

Figure 9:
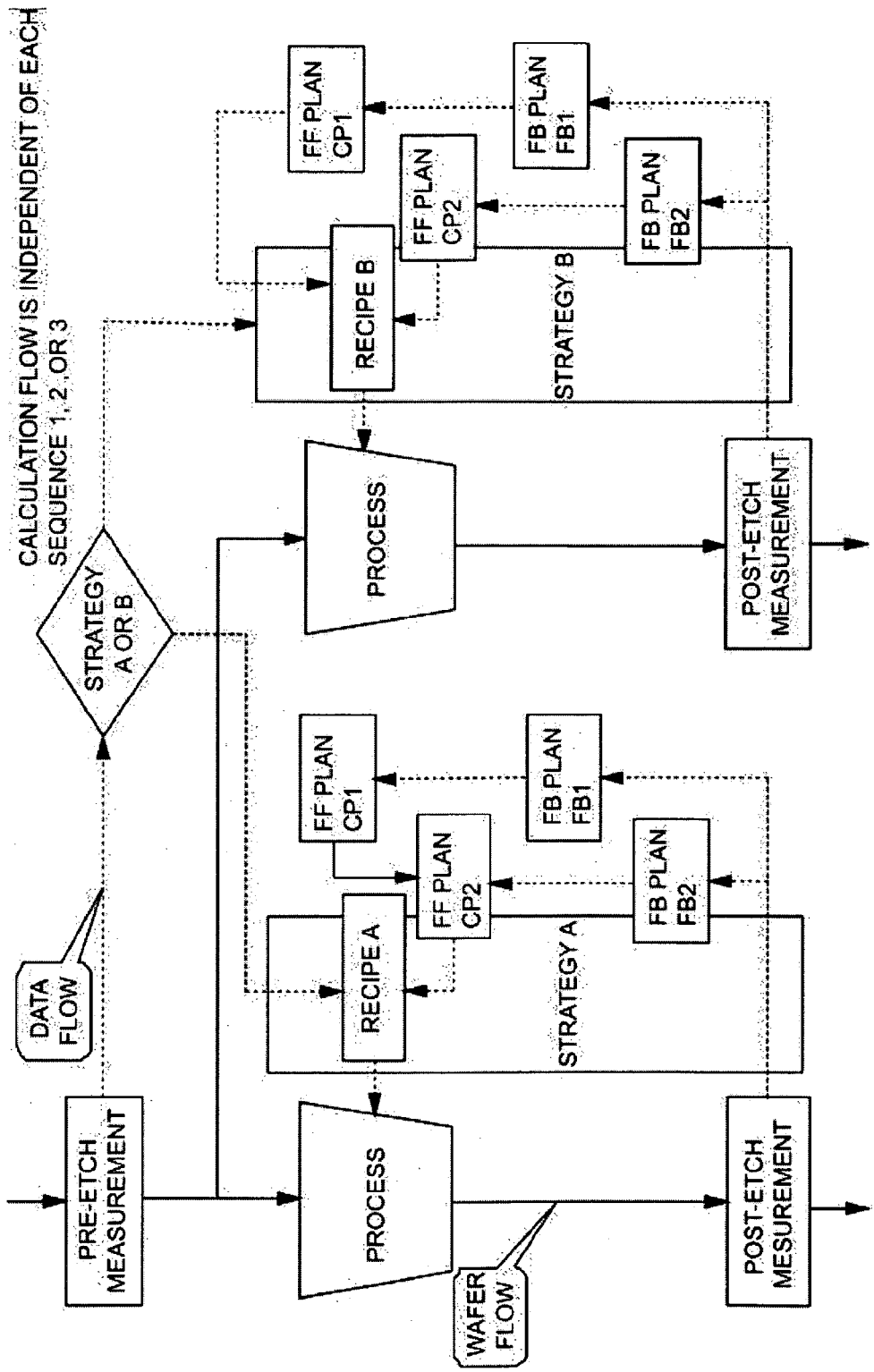
FIG. 9 shows a simplified block diagram of a cascaded control system in accordance with an embodiment of the invention.

FIG. 9 shows a simplified block diagram of a cascaded control system in accordance with an embodiment of the invention. In the illustrated embodiment, two strategies A and B are shown. As would be appreciated by those skilled in the art, however, a control system including only these two strategies, or only two strategies, is not required for the invention. Alternately, a cascaded control system can comprise multiple strategies.

Multiple measurement structures can be used for the pre-etch measurement and/or the post-etch measurement process.

Figure 10:
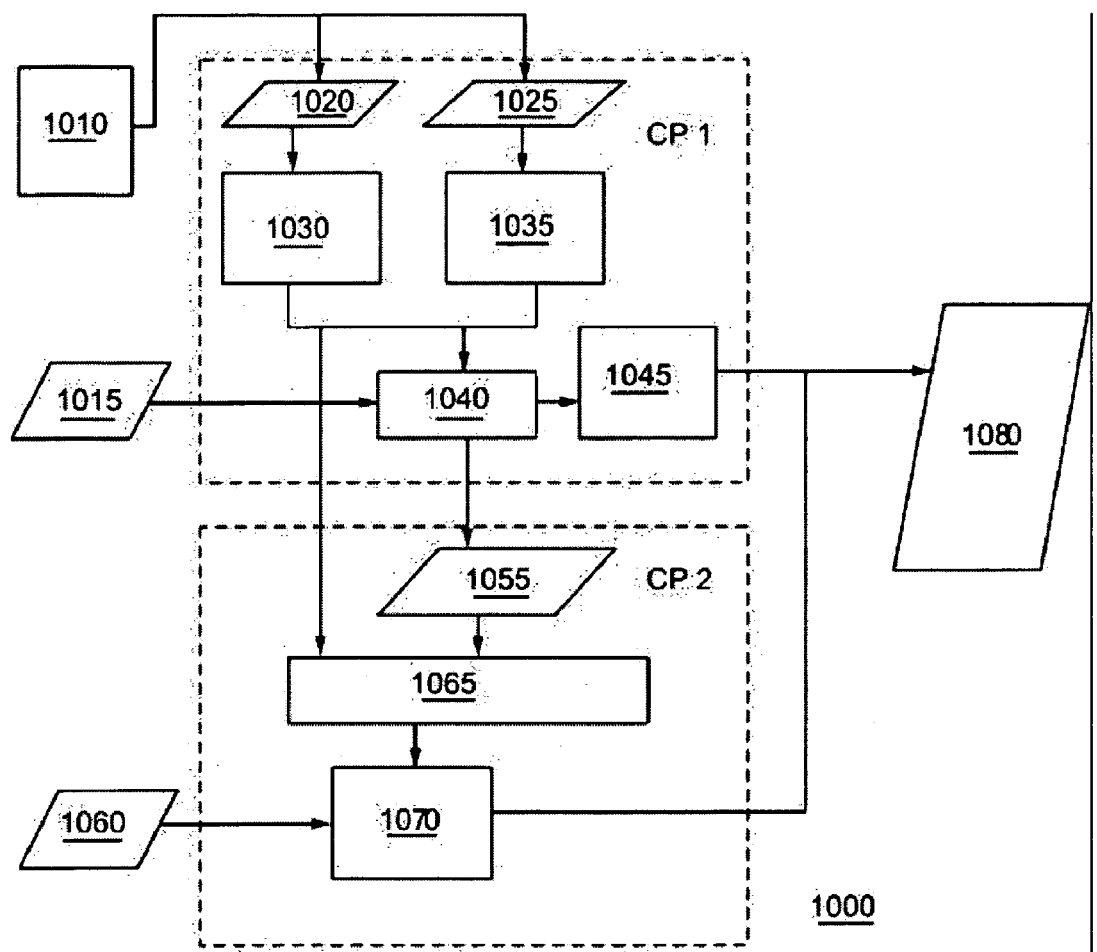
FIG. 10 shows a simplified sequence diagram for a method of operating a processing system in accordance with an embodiment of the invention.

FIG. 10 shows a simplified sequence diagram for a method of operating a processing system in accordance with an embodiment of the invention. In the illustrated embodiment, a cascading feed-forward wafer-to-wafer calculation sequence 1000 is shown, but this is not required for the invention. Alternately, the sequence can be lot-based or batch-based.

In the illustrated embodiment, sequence 1000 includes two control plans CP1 and CP2, but this is not required for the invention. Alternately, a different number of control plans may be used. For example, the control plans can include at least one of a Trim Control plan for controlling a trimming process, an Iso/Nested control plan for controlling an Iso/Nested etching and or deposition process, and a BARC open control plan for controlling a BARC etching process.

Control plan CP1 can be coupled to a first input element 1010 and can include one or more data elements, such as 1020 and 1025. Alternately, a different number of input elements and/or data elements can be used. The data element 1020 can include "Isolated" data and can include metrology data for at least one area on the wafer that comprises isolated structures, features, trenches, or vias, or combinations thereof. The data element 1025 can include "Nested" data and can include metrology data for at least one area on the wafer that comprises dense and/or nested structures, features, trenches, or vias, or combinations thereof. Alternately, other data elements (not shown) can be included such as a "Reference", "Mixed", or "Nominal" data element.

The first input element 1010 can comprise Optical Digital Profilometry (ODP) data from an integrated metrology module (IMM), such as an iODP module from Tokyo Electron Ltd. Alternately, the first input element 1010 may include SEM data and/or TEM data. The data can comprise measured data for at least one of a resist feature, a softmask feature, and a hardmask feature.

The control plan CP1 can also include data conversion elements, such as 1030 and 1035. The data conversion element 1030 can be coupled to the data element 1020 and can be used to convert one or more of the data items in the data element 1020. For example, the data conversion element 1030 can be used to calibrate the "Isolated" data to "CD-SEM" data. An equation and/or table can be established that relates the metrology data for "isolated" structures from one metrology module (IMM) to another metrology module (SEM). The data conversion element 1035 can be coupled to the data element 1025 and can be used to convert one or more of the data items in the data element 1025. For example, the data conversion element 1035 can be used to calibrate the "Nested" data to "CD-SEM" data. An equation and/or table can be established that relates the metrology data for "nested" structures from one metrology module (IMM) to another metrology module (SEM). One metrology module may be used to provide "Reference" data.

A second input element 1015 can be coupled to the control plan CP1 and can comprise input data and/or output data for a process module in a processing tool. Alternately, the second input element 1015 may include historical data. The second input element 1015 can comprise a desired value for a process result or a process input. For example, the second input element 1015 can a "Delta Target" value.

In addition, the control plan CP1 can include one or more computational elements, such as 1040 and 1045. The computational element 1040 can be coupled to the second input element 1015, the data conversion elements 1030, 1035, and to one or more other control plans. In one embodiment, the computational element 1040 can be used to compute one or more processing parameters. For example, the control plan CP1 can be a trim plan for controlling an etch process, and one or more process parameters can be controlled to optimize the etch process for isolated and/or nested structures. In one case, the desired process result can be a "Delta Trim" value. In another example, the control plan CP1 can be an Iso/Nested etching plan for controlling an etch process, and one or more process parameters can be controlled to provide a higher etching rate for isolated structures. Alternately, a higher etching rate may be provided for nested structures. In other cases, the desired process result can be a "Nested Trim" value or an "Isolated Trim" value.

The computational element 1045 can be coupled to the computational element 1040, and can provide one or more outputs 1080. In one embodiment, the computational element 1045 can be used to compute one or more recipe parameters, and the outputs 1080 can include one or more recipe parameters for one or more process steps. For example, step time may be a computed recipe parameter.

A third input element 1060 can be coupled to the second control plan CP2 and can comprise input data and/or output data for a process module in a processing tool. Alternately, the third input element 1060 may include historical data. In one embodiment, the third input element 1060 can comprise a desired value for a process result or a process input. For example, the third input element 1060 can a "Trim Target" value.

The control plan CP2 can be coupled to one or more other control plans, such as the control plan CP1, and can include one or more data elements from other plans, such as the data element 1055. Alternately, a different number of control plans and/or data elements can be used. The data element 1055 can comprise calculated data from a control plan, collected data from a data collection plan, or data from an analysis plan, or a combination thereof. Alternately, the data element 1055 may include other feed forward and/or feedback data items.

In addition, the second control plan CP2 can include one or more computational elements, such as 1065 and 1070. The computational element 1065 can be coupled to the data element 1055 and to one or more other computational elements in other plans, such as the data conversion elements 1030 and 1035. In one embodiment, the computational element 1065 can be used to compute one or more processing parameters. For example, the computational element 1065 can be used to compute a "BARC Trim" value using a "Delta Trim" value as an input.

The computational element 1070 can be coupled to the third input element 1060, the computational element 1065, and to one or more output elements, such as the outputs 1080. In one embodiment, the computational element 1065 can be used to compute one or more processing parameters. For example, the computational element 1075 can be used to compute a "BARC Trim" value using a "Trim Target" value as an input. Alternately, flow data for one or more process gasses or one or more flow ratios for the process gasses can be computed. For example, a flow ratio can be provided for $O_2$ and $CF_4$. Alternately, the outputs 1080 may include other process data and/or tool data.

For example, after the data has been collected, the data can be sent to a Fault Detection program for run-rule evaluation. Fault limits can be calculated automatically based on historical data or entered manually based on the customer's experience or process knowledge, or obtained from a host computer. The data can be compared with the warning and control limits, and when a run-rule is violated, an alarm can be generated, indicating the process has exceeded statistical limits. When an alarm is generated, the controller 120 can perform either notification or intervention. Notification can be via e-mail or by an e-mail activated pager. In addition, the controller 120 can perform an intervention: either pausing the process at the end of the current lot, or pausing the process at the end of the current wafer. The controller 120 can identify the processing module that caused the alarm to be generated.

Figure 11:
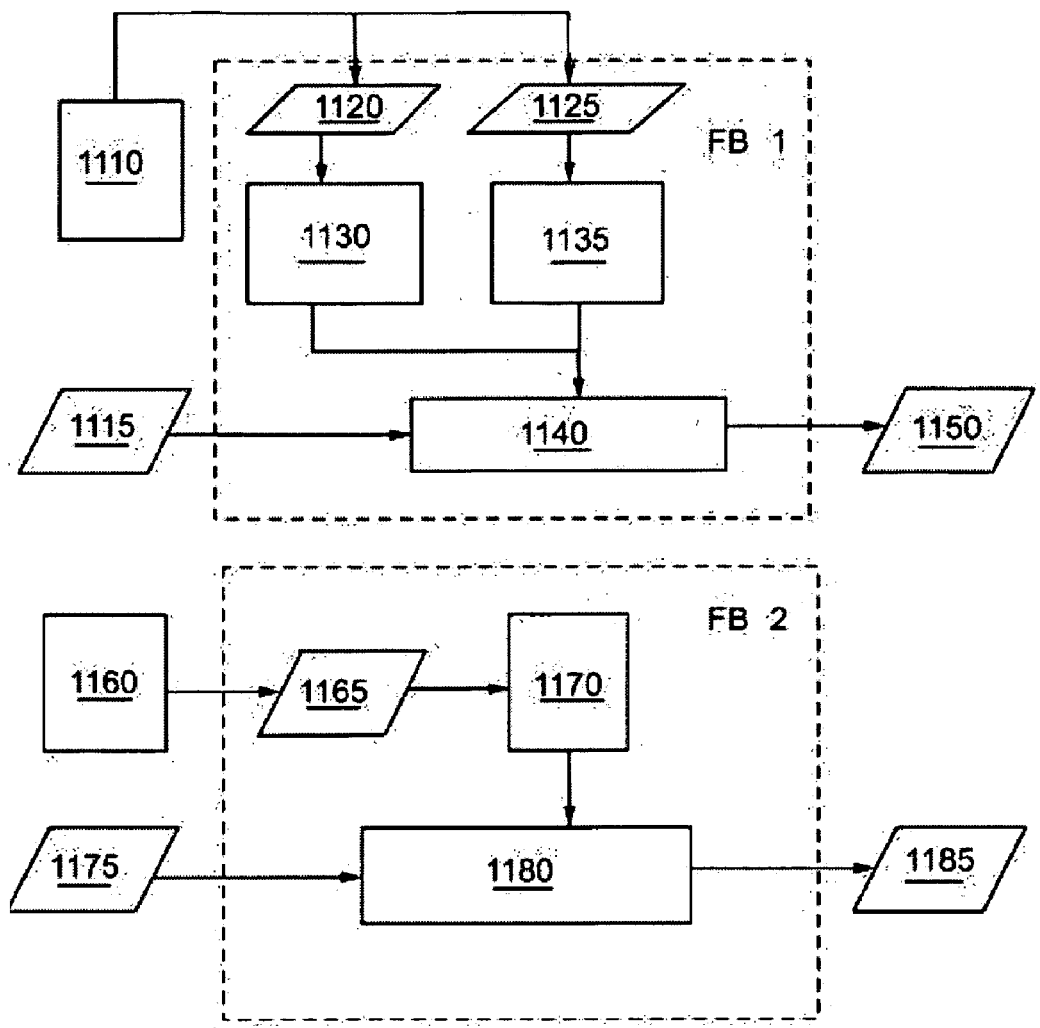
FIG. 11 shows a simplified sequence diagram for method of operating a processing system in accordance with another embodiment of the invention.

FIG. 11 shows a simplified sequence diagram for method of operating a processing system in accordance with another embodiment of the invention. In the illustrated embodiment, a feedback flow sequence 1100 is shown, but this is not required for the invention. Alternately, the sequence can be a different sequence.

In the illustrated embodiment, the sequence 1100 includes two feedback plans FB1 and FB2, but this is not required for the invention. Alternately, a different number of feedback plans may be used. For example, separate feedback plans may be used for isolated and nested conditions, and other feedback plans may also be used.

The feedback plan FB1 can be coupled to a first input element 1110 and can include one or more data elements, such as 1120 and 1125. Alternately, a different number of input elements and/or data elements can be used. The data element 1120 can include post processed "Iso" data and can include post process metrology data for at least one area on the wafer that comprises isolated structures/features, trenches, or vias, or combinations thereof. The data element 1125 can include post processed "Nested" data and can include post process metrology data for at least one area on the wafer that comprises nested structures/features, trenches, or vias, or combinations thereof. Alternately, other data elements (not shown) can be included such as a "Reference", "Mixed", or "Nominal" data element.

The first input element 1110 can comprise post process ODP data from an integrated metrology module (IMM), such as an iODP module from Tokyo Electron Ltd. Alternately, the first input element 1110 may include post process SEM data and/or TEM data. The data can comprise post process measured data for at least one of resist features, softmask features, and hardmask features.

The feedback plan FB1 can also include data conversion elements, such as 1130 and 1135. The data conversion element 1130 can be coupled to the data element 1120 and can be used to convert one or more of the post processed data items in the data element 1120. For example, the data conversion element 1130 can be used to calibrate the post-processed "Iso" data to "CD-SEM" data. An equation and/or table can be established that relates the metrology data for "isolated" structures from one metrology module (IMM) to another metrology module (SEM). The data conversion element 1135 can be coupled to the data element 1125 and can be used to convert one or more of the post processed data items in the data element 1125. For example, the data conversion element 1135 can be used to calibrate the post-processed "Nested" data to "CD-SEM" data. An equation and/or table can be established that relates the metrology data for "nested" structures from one metrology module (IMM) to another metrology module (SEM). Alternately, "Reference" data may be used. In addition, the data conversion element 1130, and the data conversion element 1135 can be coupled to one or more other plans, such as a control plan.

The second input element 1115 can be coupled to the feedback plan FB1 and can comprise input data and/or output data for a process module in a processing tool, such as a TELIUS™ tool from Tokyo Electron Ltd. Alternately, the second input element 1115 may include historical data. In one embodiment, the second input element 1115 can comprise a desired value for a process parameter, such as a "Delta Target."

In addition, the feedback plan FB1 can include one or more computational elements, such as 1140. The computational element 1140 can be coupled to the second input element 1115, the data conversion elements 1130, 1135, and provide one or more outputs 1150. In one embodiment, the computational element 1140 can be used to compute one or more processing parameters. For example, in an etch process, one or more process parameters can be controlled to optimize the etch process for isolated and/or nested structures. In one case, the process parameter may be a "Delta Error". Alternately, the outputs 1150 may include other process data and/or tool data.

The feedback plan FB2 can be coupled to a third input element 1160 and can include one or more data elements, such as 1165. Alternately, a different number of input elements and/or data elements can be used. The data element 1165 can include post processed "Iso" data and can include post process metrology data for at least one area on the wafer that comprises isolated structures/features, trenches, or vias, or combinations thereof. The third input element 1160 can comprise post process ODP data from an integrated metrology module (IMM), such as an iODP module from Tokyo Electron Ltd. Alternately, the third input element 1160 may include historical data.

In addition, the feedback plan FB2 can include one or more computational elements, such as 1170 and 1180. The computational element 1170 can be coupled to the data element 1165 and the computational element 1180 and can provide calibrated data to the computational element 1180. The computational element 1180 can be coupled to a fourth input element 1175 and the computational element 1170 and can provide a computed output 1185, such as "Trim Error". In one embodiment, the computational element 1180 can be used to compute one or more processing parameters. For example, in an etch process, one or more process parameters can be controlled to optimize the etch process for isolated and/or nested structures. In one case, the process parameter may be a "Trim Error". Alternately, the output 1185 may include other process data and/or tool data.

Figure 12:
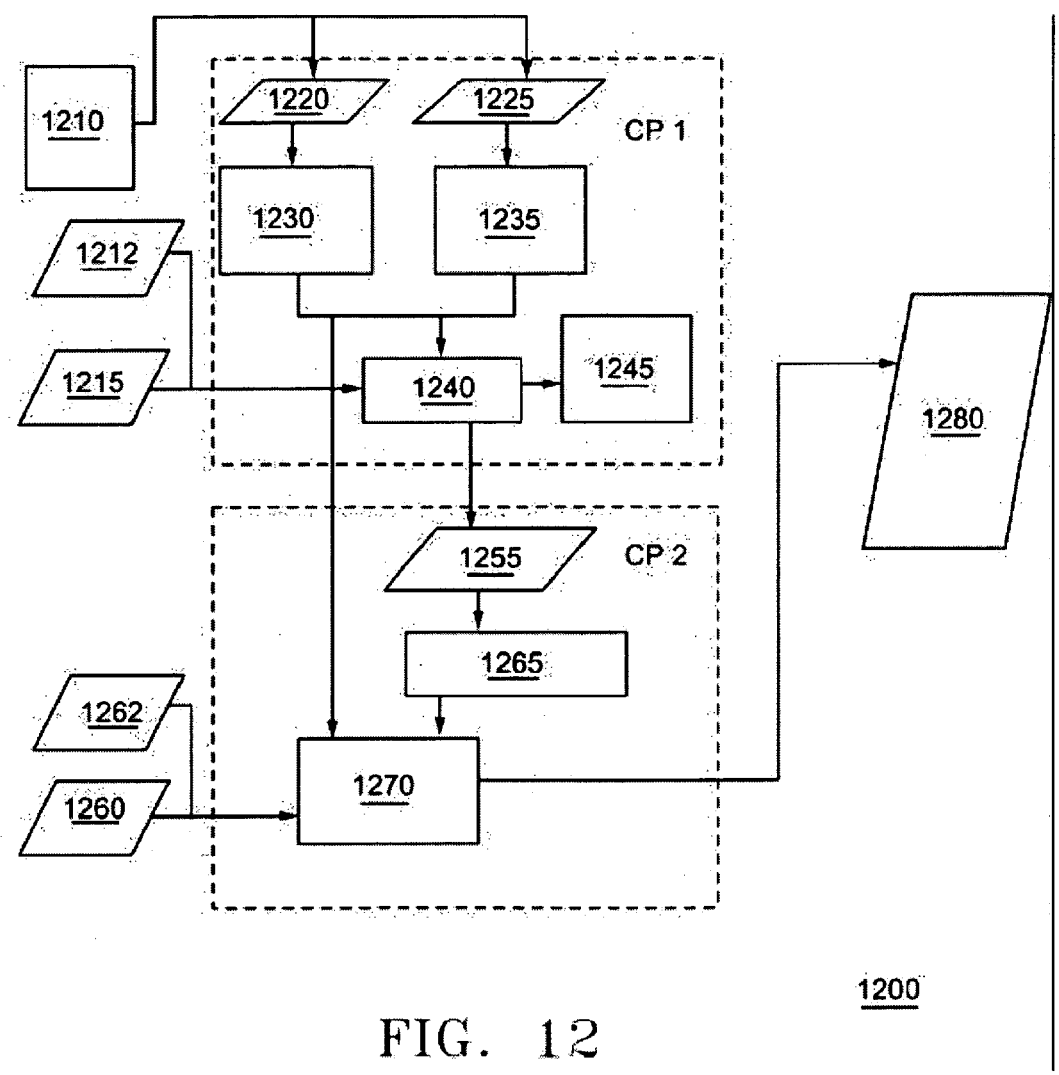
FIG. 12 shows a simplified sequence diagram for method of operating a processing system in accordance with another embodiment of the invention.

FIG. 12 shows a simplified sequence diagram for a method of operating a processing system in accordance with another embodiment of the invention. In the illustrated embodiment, a cascading feed-forward and feedback wafer-to-wafer calculation sequence 1200 is shown, but this is not required for the invention. Alternately, the sequence 1200 can be lot-based, or batch-based.

In the illustrated embodiment, the sequence 1200 includes two control plans CP1 and CP2, but this is not required for the invention. Alternately, a different number of control plans may be used. For example, separate control plans may be used for isolated and nested conditions, and other control plans may also be used.

The control plan CP1 can be coupled to a first input element 1210 and can include one or more data elements, such as 1220 and 1225. Alternately, a different number of input elements and/or data elements can be used. The data element 1220 can include "Iso" data and can include metrology data for at least one area on the wafer that comprises isolated structures/features, trenches, or vias, or combinations thereof. The data element 1225 can include "Nested" data and can include metrology data for at least one area on the wafer that comprises nested structures/features, trenches, or vias, or combinations thereof. Alternately, other data elements (not shown) can be included such as a "Reference", "Mixed", or "Nominal" data element.

The first input element 1210 can comprise ODP data from an integrated metrology module (IMM), such as an iODP module from Tokyo Electron Ltd. Alternately, the first input element 1210 may include SEM data and/or TEM data.

The control plan CP1 can also include data conversion elements, such as 1230 and 1235. The data conversion element 1230 can be coupled to the data element 1220 and can be used to convert one or more of the data items in the data element 1220. For example, the data conversion element 1230 can be used to calibrate the "Iso" data to "CD-SEM" data. An equation and/or table can be established that relates the metrology data for "isolated" structures from one metrology module (IMM) to another metrology module (SEM). The data conversion element 1235 can be coupled to the data element 1225 and can be used to convert one or more of the data items in the data element 1225. For example, the data conversion element 1235 can be used to calibrate the "Nested" data to "CD-SEM" data. An equation and/or table can be established that relates the metrology data for "nested" structures from one metrology module (IMM) to another metrology module (SEM). One metrology module may be used to provide "Reference" data.

The second input element 1215 can be coupled to the control plan CP1 and can comprise input data and/or output data for a process module in a processing tool, such as a TELIUS™ tool from Tokyo Electron Ltd. Alternately, the second input element 1215 may include historical data. In one embodiment, the second input element 1215 can comprise a desired value for a process parameter, such as a "Delta Target"

The third input element 1212 can be coupled to the control plan CP1 and can comprise feedback data and/or feed forward data for a process module in a processing tool, such as a TELIUS™ tool from Tokyo Electron Ltd. Alternately, the third input element 1212 may include historical data. In one embodiment, the third input element 1212 can comprise a difference (error value) between an actual value and a desired value for a process parameter, such as a "Delta Error"

In addition, the control plan CP1 can include one or more computational elements, such as 1240 and 1245. The computational element 1240 can be coupled to the second input element 1215, the third input element 1212, the data conversion elements 1230, 1235, and to one or more other control plans. In one embodiment, the computational element 1240 can use feed forward data and feedback data to compute one or more processing parameters. For example, in an etch process, one or more process parameters can be controlled to optimize the etch process for isolated and/or nested structures. In one case, the feed forward data can include "Delta Target" data, the feedback data can include "Delta Error" data, and the process parameter can include an etch amount, such as a "Bias Trim" value.

The computational element 1245 can be coupled to the computational element 1240, and can provide one or more outputs 1280. In one embodiment, the computational element 1245 can be used to compute one or more recipe parameters, and the outputs 1280 may include "step time" data for one or more process steps. Alternately, the outputs 1280 may include other process data and/or tool data.

A fourth input element 1260 and a fifth input element 1262 can be coupled to the second control plan CP2 and can comprise input data and/or output data for a process module in a processing tool, such as a TELIUS™ tool from Tokyo Electron Ltd. Alternately, the fourth and/or fifth input element 1260, 1262 may include historical data. In one embodiment, the fourth input element 1260 can comprise feed forward data such as a desired value for a process result, and the fifth input element 1262 can comprise feedback data such as error data for a process result. For example, the process result can be a "Trim Target", and the error data can include a "Trim Error".

The control plan CP2 can be coupled to one or more other control plans, such as the control plan CP1, and can include one or more data elements, such as 1255. Alternately, a different number of control plans and/or data elements can be used. The data element 1255 can comprise calculated data, such as "Bias Trim" data and/or "Step Time" data. Alternately, the data element 1255 may include other feed forward and/or feedback data items.

In addition, the second control plan CP2 can include one or more computational elements, such as 1265 and 1270. The computational element 1265 can be coupled to the third input element 1260, the data element 1255 and to one or more other computational elements, such as 1270. In one embodiment, the computational element 1265 can be used to compute one or more processing parameters. For example, in an etch process, one or more process parameters can be controlled to optimize the etch process for isolated and/or nested structures. In one case, the process parameter may be a "BARC Trim" and it can be computed using a "Delta Trim" value.

The computational element 1270 can be coupled to the computational element 1265, and can provide one or more outputs 1280. In one embodiment, the computational element 1270 can be used to compute one or more recipe parameters, and the outputs 1280 may include flow data for one or more process gasses or one or more flow ratios for the process gasses. For example, a flow ratio can be provided for $O_2$ and $CF_4$. Alternately, the outputs 1280 may include other process data and/or tool data.

Figure 13:
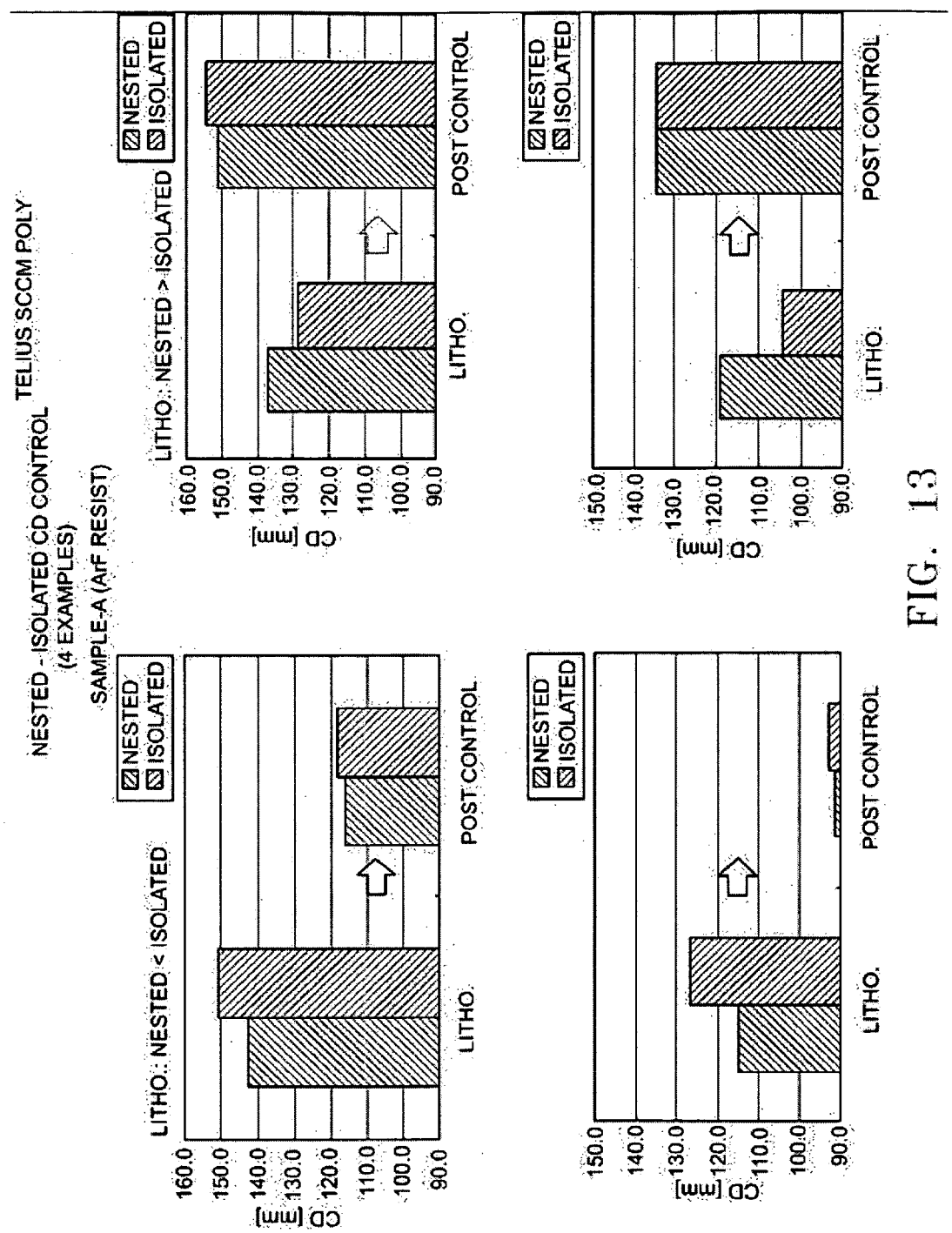
FIG. 13 shows exemplary results in accordance with an embodiment of the invention.

FIG. 13 shows exemplary results in accordance with an embodiment of the invention. In the illustrated embodiment, post lithography results are shown along with post processing results. The data shows excellent uniformity for nested and isolated features for wafers that were processed using the method of the present invention. Two different samples that included an ArF Resist were used.

Figure 14:
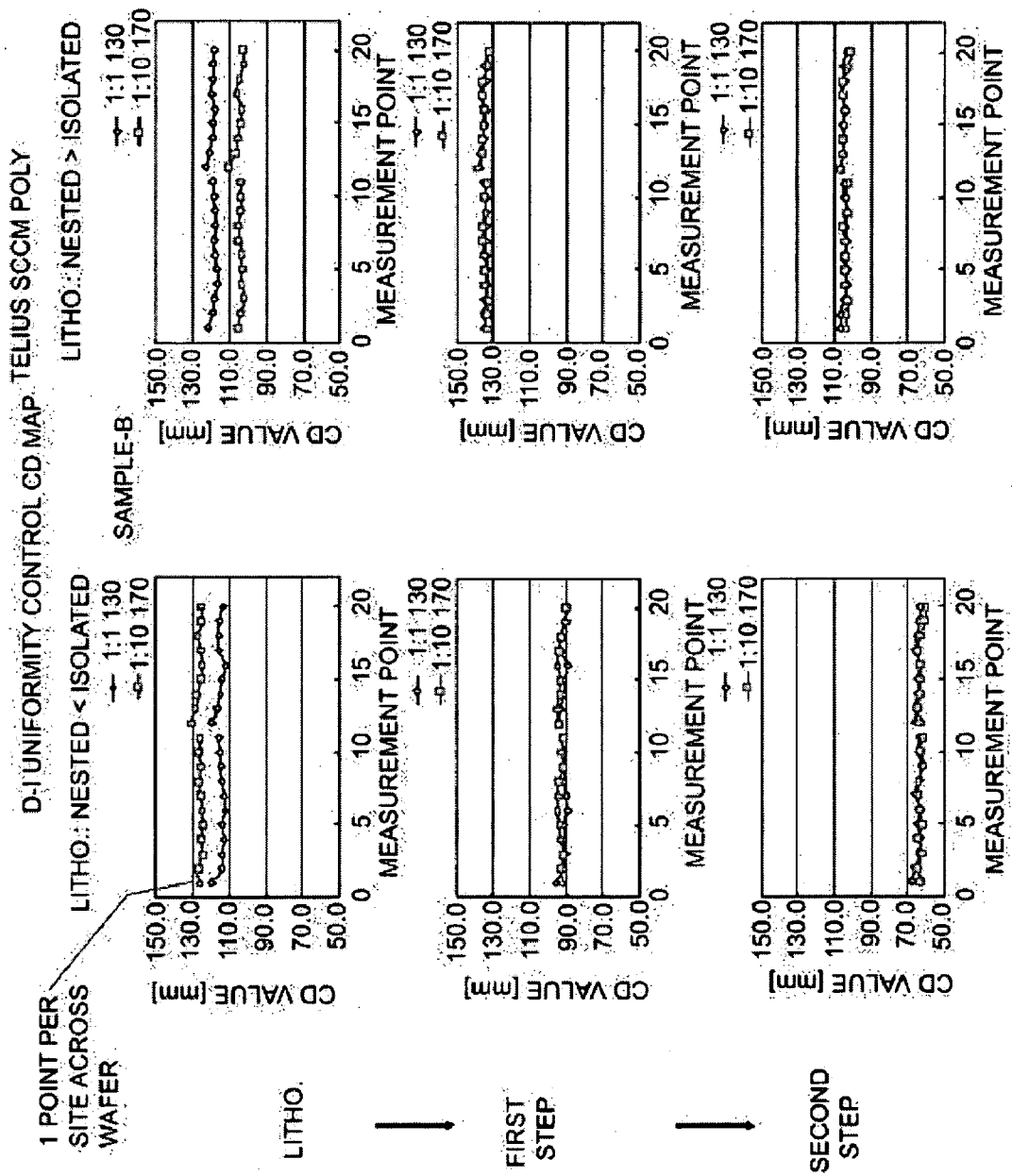
FIG. 14 shows additional exemplary results in accordance with an embodiment of the invention.

FIG. 14 shows additional exemplary results in accordance with an embodiment of the invention. In the illustrated embodiment, uniformity results are shown after three different processes. The data shows excellent uniformity for nested and isolated features across the wafers that were processed using the method of the present invention.

Figure 15:
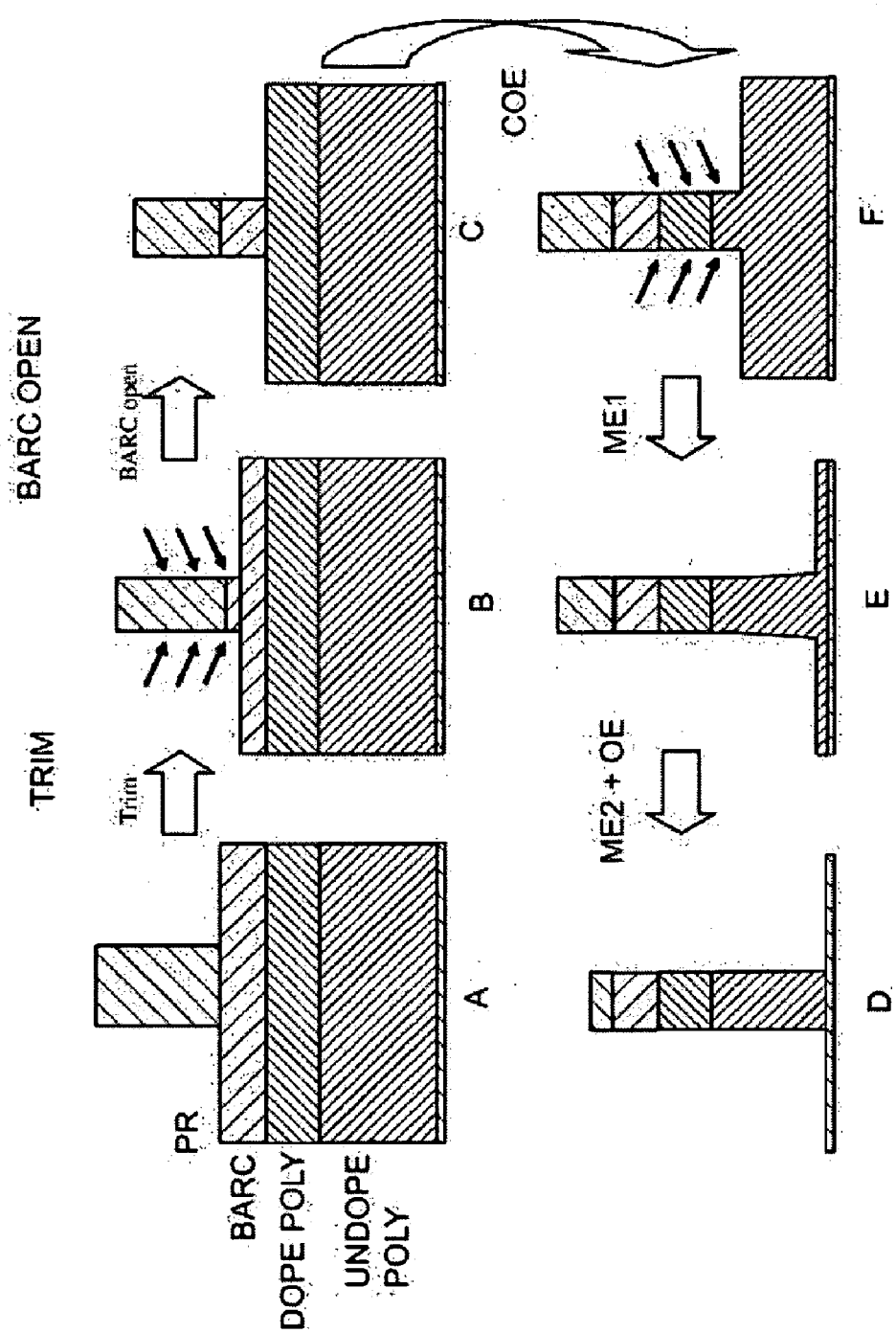
FIG. 15 shows a simplified flow diagram of another procedure in accordance with another embodiment of the invention.

FIG. 15 shows a simplified flow diagram of another procedure in accordance with another embodiment of the invention. In the illustrated embodiment, a number of steps ("A"-"F") are shown, but this is not required. Alternately, a different steps and different combinations may be used.

In step "A", the wafer is shown in an initial wafer state, and a photoresist feature is shown on a BARC layer that is coupled to a doped poly layer that is coupled to an un-doped poly layer.

In step "B", the wafer is shown in a second wafer state, and a trimmed photoresist feature is shown on a partially etched BARC layer that is coupled to a doped poly layer that is coupled to an un-doped poly layer. A trimming process can be performed to create the second wafer state. An optical end point detector (EPD) can be used to determine when the second state has been achieved. In one case, the remaining BARC is substantially equal to the desired final CD. In another case, an iso/nested etch process can be performed to make the remaining BARC substantially equal to the desired final CD In step "C", the wafer is shown in a third wafer state, and a slightly reduced photoresist feature is shown on a totally etched BARC layer that is coupled to a doped poly layer that is coupled to an un-doped poly layer. A BARC open process can be performed to create the third wafer state. An optical end point detector (EPD) can be used to determine when the third state has been achieved. In one case, the remaining BARC is substantially equal to the desired final CD.

In step "D", the wafer is shown in a fourth wafer state, and a slightly reduced photoresist feature is shown on a totally etched BARC layer that is coupled to a totally etched doped poly layer that is coupled to a partially etched un-doped poly layer. A poly etch COE process can be performed to create the fourth wafer state. An optical end point detector (EPD) can be used to determine when the fourth state has been achieved. In one case, the EPD can be used to determine the amount of Poly-Si remaining.

In step "E", a fifth wafer state is shown, and a slightly reduced photoresist feature is shown on a totally etched BARC layer that is coupled to a totally etched doped poly layer that is coupled to a nearly-completely-etched un-doped poly-Si layer. A first Poly-Si main etch ME1 process can be performed to create the fifth wafer state, and the ME1 process uses a faster etch rate to achieve a uniform feature profile. An optical end point detector (EPD) can be used to determine when the fifth state has been achieved. In one case, the EPD can be used to determine the amount of Poly-Si remaining to ensure a stable profile.

In step "F", a sixth wafer state is shown, and a slightly reduced photoresist feature is shown on a totally etched BARC layer that is coupled to a totally etched doped poly layer that is coupled to a totally-etched un-doped poly-Si layer. A second Poly-Si main etch ME2 process and an over-etch OE process can be performed to create the sixth wafer state, and the ME2 process uses a slower etch rate to preserve the uniform feature profile. An optical end point detector (EPD) can be used to determine when the sixth state has been achieved. In one case, the EPD can be used to determine the amount of Poly-Si remaining to ensure a stable profile and the desired CD.

The processing system can include controllers that can operate as a single input single output (SISO) devices, as a single input multiple output (SIMO) devices, as a multiple input single output (MISO) devices, and as a multiple input multiple output (MIMO) devices. In addition, inputs and outputs can be within a controller and/or between one or more controllers. For example, when multiple inputs such as CD and sidewall angle are being used, inputs and outputs can be fed forward and backward between two modules, (i.e., one for CD control and one for sidewall angle control).

In addition, a mask open controller can also be used. In a multi-process case including multiple modules, information can be fed-forward or fed-back from one controller to another controller.

The previously described feed forward and feedback sequences can be performed using multiple inputs and/or multiple outputs. The control plans, recipes, models, data elements, data conversion elements, computational elements, and/or control strategy elements can include multiple inputs and/or multiple outputs.

In one embodiment, the processing system and the host system cooperate to determine the correct process sequence to use to process a wafer. For example, in a trimming process such as a hard mask or a soft mask trim process, some wafers may require one pass through an etch module, and other wafers may require more than one pas through an etch module. In this case, the host system can allow the processing system to determine the number of passes through the etch module and control plans and/or strategies can be established to manage the different number of process objects in the process sequences for the different wafers.

Furthermore, feedback data can be computed and used to update a process recipe and/or a process model.

In one embodiment, the processing system controller can determine a control strategy (recipe) for each element in a process sequence. Alternately, a control strategy (recipe) may be determined, sent, and/or verified by the host system.

Figure 16:
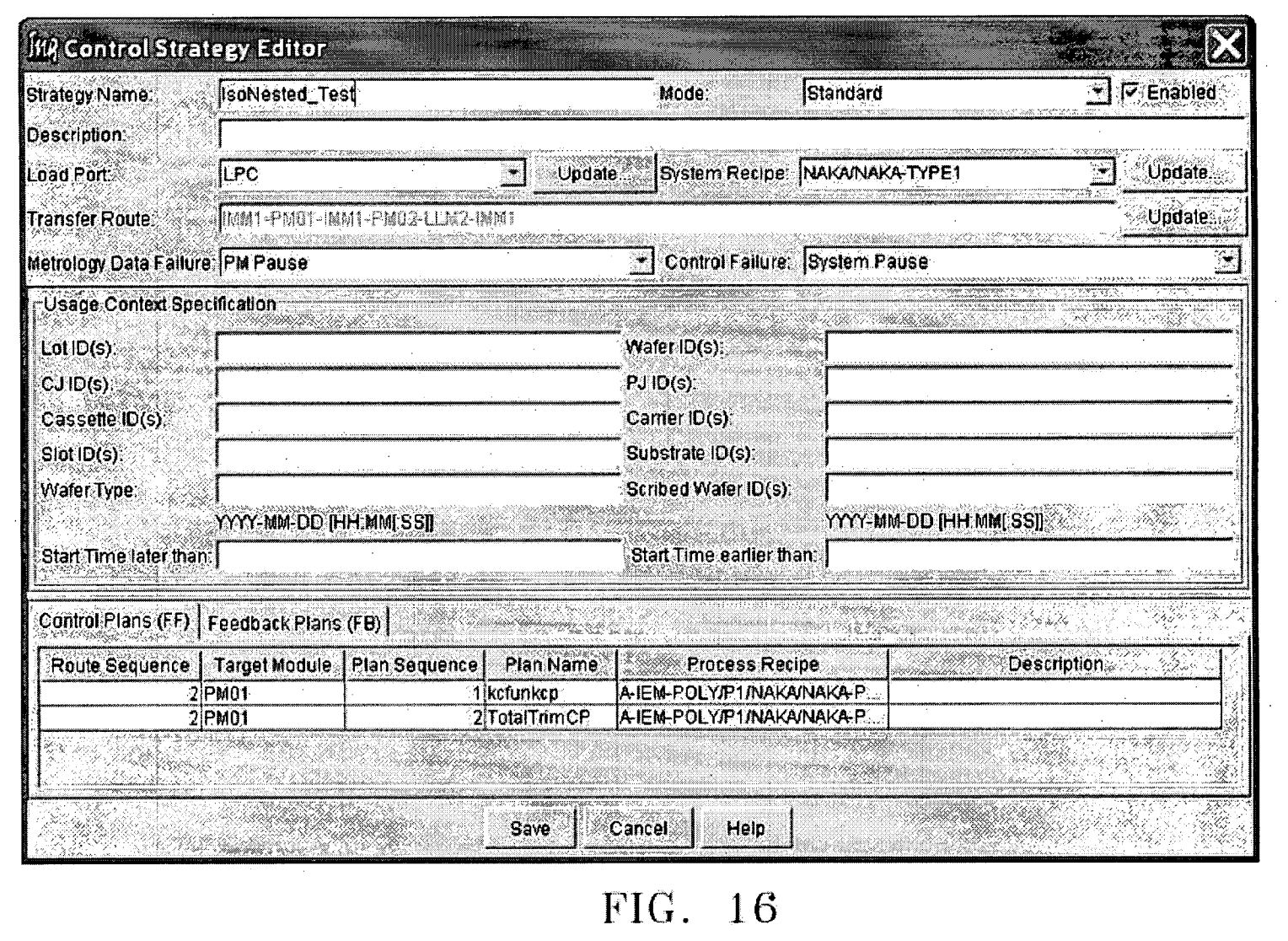

FIG. 16 illustrates an exemplary view of an Iso/Nested Control Strategy Screen in accordance with an embodiment of the invention. An Iso/Nested Control Strategy Screen can comprise a number of configuration items. Using an Iso/Nested Control Strategy Screen, a user can perform an Iso/Nested Control Strategy configuration, view an existing Iso/Nested Control Strategy, create a new Iso/Nested Control Strategy, copy an existing Iso/Nested Control Strategy, edit an existing Iso/Nested Control Strategy, delete an existing Iso/Nested Control Strategy, and test an Iso/Nested Control Strategy. For example, a dropdown list can be used to select a course of action.

Figure 17:
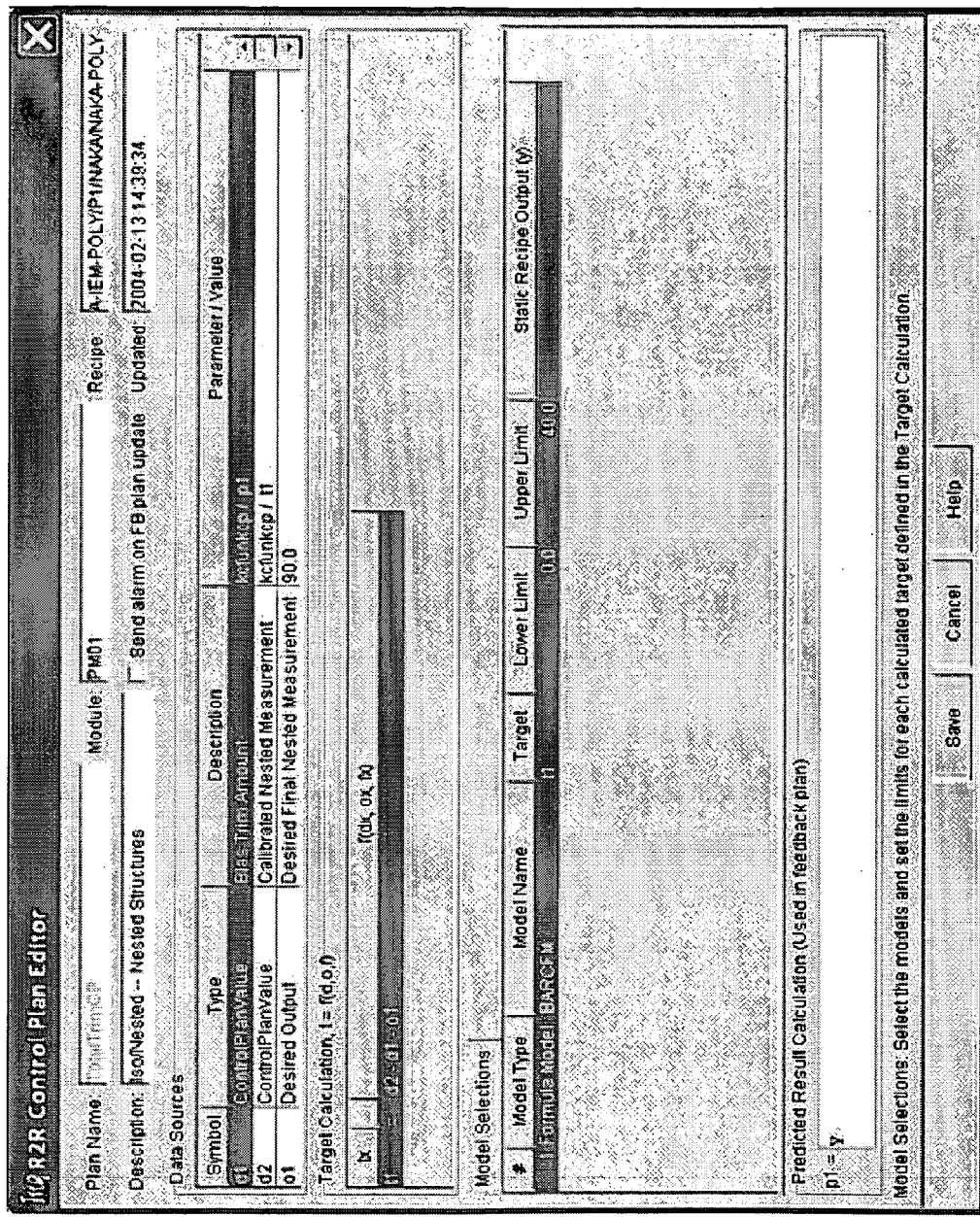
FIG. 17 illustrates an exemplary view of a Nested Control Plan Editor Screen in accordance with an embodiment of the invention.

FIG. 17 illustrates an exemplary view of a Nested Control Plan Editor Screen in accordance with an embodiment of the invention.

Figure 18:
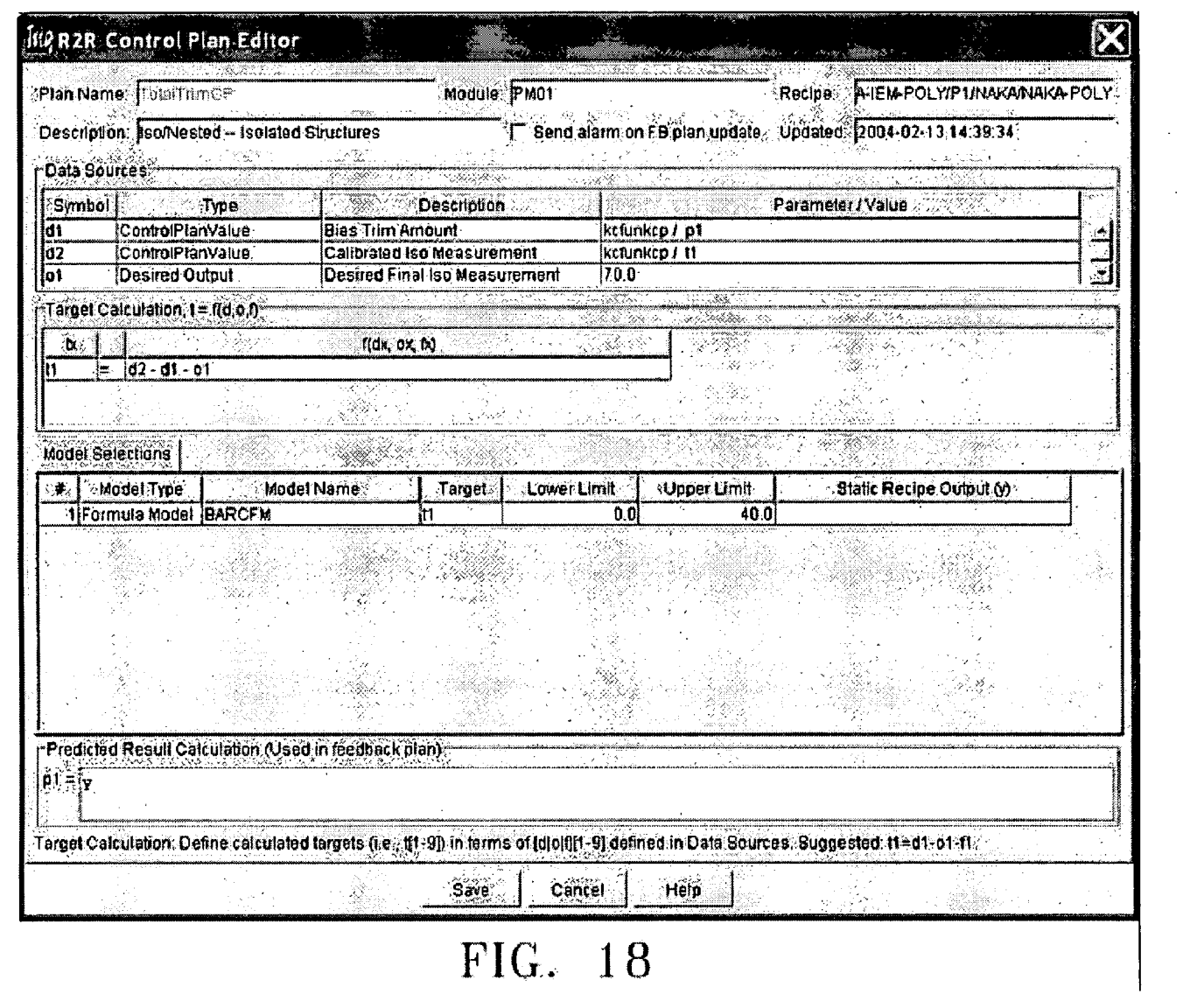

FIG. 18 illustrates an exemplary view of an Isolated Control Plan Editor Screen in accordance with an embodiment of the invention. Alternately, other plans can be used.

To create a Nested and/or Isolated Control Plan, a user can select the plan name item and select a new Control Plan or an existing plan or model. For example, on an Iso/Nested Control Strategy screen, a drop-down menu can appear and the Add Plan selection can be chosen.

A Nested and/or Isolated Control Plan screen can comprise a number of fields. The Plan Name field can be used to enter/edit a name for a Nested and/or Isolated control plan. A Module field can be used to enter/edit a module name. For example, if the plan is associated with a strategy, the module field may be automatically filled in. If the plan is unassociated, the module field can be used to select a process module or a measurement module. The Recipe field can be used to enter/edit a recipe. For example, if the plan is associated with a strategy, the recipe field may be automatically filled in. If the plan is unassociated, the field can be used to select a process recipe for a process module or a measurement recipe for a measurement module.

The Description field can be used to enter/edit a description for the plan. The Updated field displays the last time the plan was changed.

The Data Sources table can be used to enter/edit a data source. For example, a Nested and/or Isolated Plan Data Source screen may be opened. The Data source table can include a source type, a data source description, and a data source parameter/value. For example, the selected source type determines the options displayed on the Data Source screen; a "Telius ODP" type can be used to define integrated metrology module data sources that are part of the processing tool; a "Desired Output" type allows the user to enter a fixed unit for the controller; a "Feedback Offset" type allows the user to define a persistent feedback variable; a "Control Plan Value" allows the user to create a variable that references the results of a different control plan (creates nested plans); the "Integrated Metrology Site Filtering" type creates tables with descriptions of each option when each data source is selected; and a "ContextItem" type allows a user to create a variable that references a context item, such as a Slot_Id, a Wafer_id, or a wafer number.

The symbol can be selected from the Symbol drop-down list, and a source type can be selected from the Data Source Type drop-down menu. For example, the data source information fields can vary depending on the chosen data source.

Three input data sources (d1, d2, d3) are shown, but this is not required. A different number of input data sources can be used, and each input data source can have a different symbol value. A data source can be a control plan value such as a desired process result or a calibrated date item. In addition, a data source can be an ODP tool, and it can be part of the processing tool, such as a Telius. Furthermore, another data source can be a SEM, and the Parameter/Value can be actual measured data such as a CD-SEM data.

In general, process control can include updating a process module recipe using metrology information measured on the wafer prior to its arrival in the process module. The controller can use the pre-processing data to determine how many visits are required to the various physical modules. The desired process result can be a "y" value in a model equation. The task is determine when the desired process result "y" is the correct value.

In the target calculation field, on a Nested and/or Isolated Control Plan screen, the target calculation can be entered. For example, the target calculation can be set equal to the data source item. Alternately, an equation may be entered that correlates one set of data with another set of data. In addition, target calculation may comprise an additional compensation term. For example, the additional compensation factor can be used to correct for errors introduced in another step, such as a photo resist step. A new target value can be a variable that is calculated at or before run time, and an equation can be used to calculate the target value.

In addition, new lower and upper limit values can be used, and these values can be entered in the lower limit field and upper limit field. For example, the new lower and upper limit values can be constants or variables that are calculated at or before run time, and equations can be used to calculate the new lower and upper limit values.

The Model Selections field can be used to edit/enter a static model and/or a formula model. For example, under the model type selection item, a selection item in the table can be used to enter and/or edit a model type. A drop down list can be activated from the table item and a selection can be made from the drop down list. One option in the drop down list allows a new model to be created; other options can be used to display and select existing models to use or to modify. Each model type can have a module name, target value, lower limit, upper limit, and recipe output associated with it. When creating a new model, a new model type can be used and entered in the model type field, and a new model name can be used and entered in the model name field.

The Predicted Result Calculation field can be used to enter a new predicted result value or select an existing predicted result value. The predicted result value can be an equation for the expected result. For example, a Control Plan can be saved when Name, Target Calculation, and Model Selection information is entered.

The # field comprises a number of the model in the list of models. The model type allows either a Static or a Formula model to be selected. The Model Name field lists the names of available models. For example, to create a new model, a "New Static Recipe" option or a "New Formula Recipe" option can be selected from a drop down list. A static control plan can be created that comprises one or more static recipes. For example, ten or more static models can be shown. The static models are shown with the same target value (t1), but this is not required. A different number of static and/or formula models can be used, and each model can have a different target value. A new target value can be calculated when each static recipe is used. The static recipe models can have different operating ranges as defined by the lower limit values and the upper limit values. In addition, the static recipe models can have different static recipe outputs, and a different static recipe output can be determined for each static recipe.

The Nested and/or Isolated control plan can include a static model recipe, or a formula model recipe, or a combination thereof. The controller can auto-generate control plans for modules. A process recipe can comprise one or more processes each comprising one or more processing steps. The process recipe can be performed in a single chamber or multiple chambers. The process recipe can be configured using at least one of a nominal recipe, a static recipe, and a formula model.

A static recipe can be a single set of recipe adjustments that are used to achieve a specific process result. A set of static recipes can be used to set up a table-based controller, or static recipes can be used along with formula models to treat ranges of the desired output where the same recipe should be used. When using feedback with static recipes, a single predicted process result can be specified in the control plan for each static recipe used.

Figure 19:
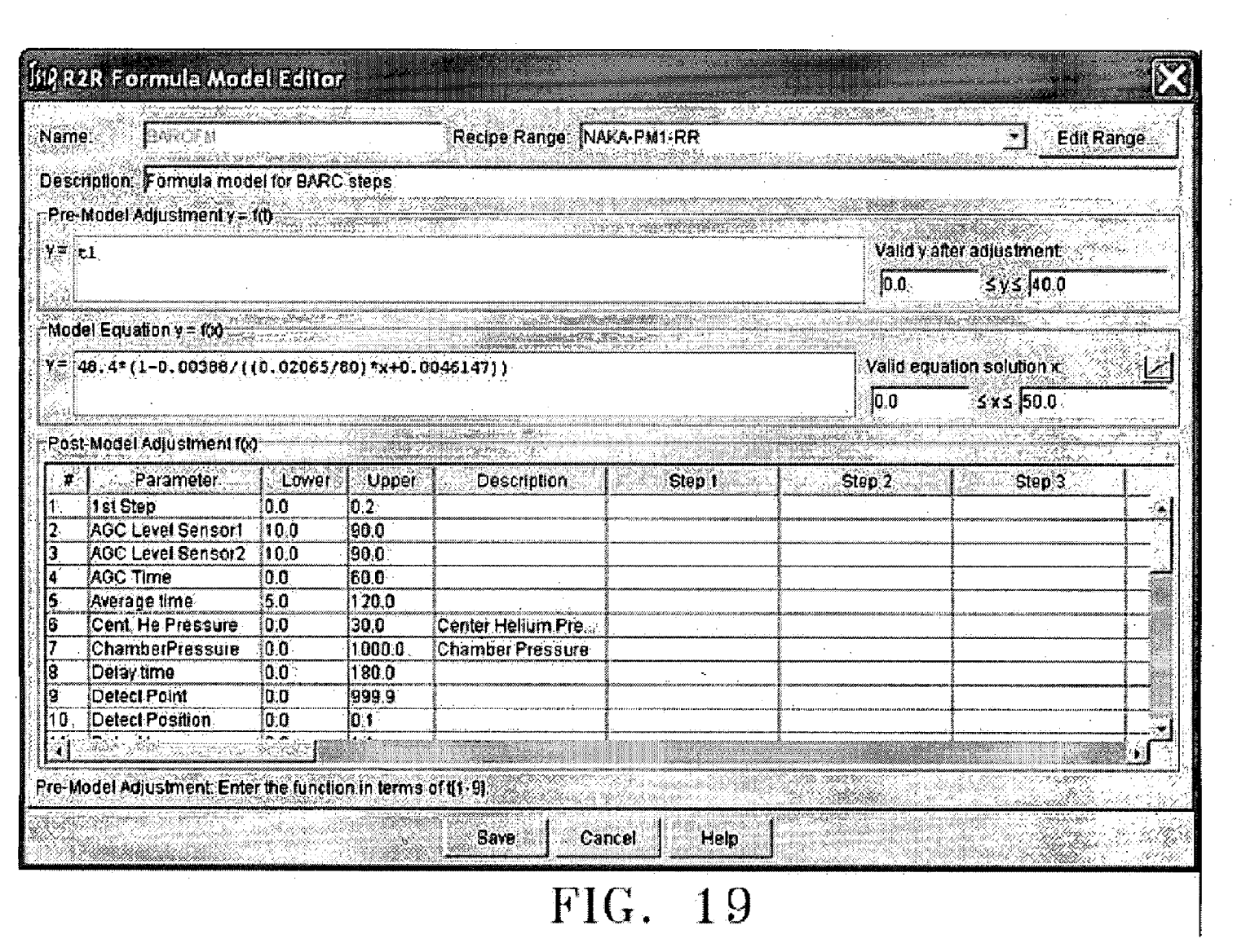

FIG. 19 illustrates an exemplary view of a Formula Model Editor Screen in accordance with an embodiment of the invention. A formula model can comprise a pre-model adjustment, a model equation, a series of post model adjustments, and a recipe parameter assignment map. The pre-model adjustment can allow the re-expression of the desired process result (usually t1) into the correct units that are used in a model equation (resulting in a value of y), and the model equation can be an expression that calculates the predicted process result as a function of one manipulated variable (x). When the model is executed, it will solve for x given the re-expressed desired process result (y). Once x is determined, the post model adjustments can be calculated, and their values will be assigned to the appropriate recipe parameters specified in the recipe parameter map.

In addition, one or more process models can be provided. A process model can be used to define a process space. A process model represents the verified relationship between the desired results (outputs) and the received variables needed to achieve those results. Process models can include equations that can include formula-based models. Formula-based models can comprise equations that contain the piece-wise associations of desired results with recipe variables based on some evaluated experimental data. A process model can be linear or non-linear. A process model can be used to verify a new process recipe, and update an existing process recipe.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of operating a semiconductor processing system comprising:

receiving a wafer comprising a soft mask layer and a bottom anti-reflective coating (BARC) layer;

receiving reference metrology data for at least one isolated structure on the wafer, at least one nested structure on the wafer, soft mask data, and BARC data;

determining a first value comprising measured size data for the at least one isolated structure on the wafer;

determining a second value comprising measured size data for the at least one nested structure on the wafer;

comparing the first value with the second value;

executing an Iso-Greater control strategy when the first value is greater than the second value, wherein the Iso-Greater control strategy comprises an Iso/Nested control plan for controlling an iso/nested etching process and at least one of a Trim Control plan for controlling a trimming process and a BARC open control plan for controlling a BARC etching process, wherein the Iso/Nested control plan for controlling the iso/nested etching process comprises:

determining a first desired target value for the iso/nested etching process, the first desired target value comprising a desired feature size after performing the iso/nested etching process, calculating a first iso-trim value using a difference between the first value and the first desired target value, calculating a first dense-trim value using a difference between the second value and the first desired target value, calculating a first ratio using the first iso-trim value and the first dense-trim value, and executing the iso/nested etching process on the wafer, wherein recipe settings for achieving the first desired target value have been determined using the calculated first ratio, determining a first final critical dimension (CD) target, calculating a first trim value using a difference between the first final CD target and the first desired target value, and executing a first trim process, wherein recipe settings for achieving the first final CD target have been determined using the first trim value; and executing a Nes-Greater control strategy when the first value is less than the second value, wherein the Nes-Greater control strategy comprises an Iso/Nested control plan for controlling an iso/nested deposition process and at least one of a Trim Control plan for controlling a trimming process and a BARC open control plan for controlling a BARC etching process, wherein the Iso/Nested control plan for controlling the iso/nested deposition process comprises:

determining a second desired target value for the iso/nested deposition process, the second desired target value comprising a desired feature size after performing the iso/nested deposition process, calculating a second iso-trim value using a difference between the first value and the second desired target value, calculating a second dense-trim value using a difference between the second value and the second desired target value, calculating a second ratio using the second iso-trim value and the second dense-trim value, and executing the iso/nested deposition process on the wafer, wherein recipe settings for achieving the second desired target value have been determined using the calculated second ratio, determining a second final critical dimension (CD) target, calculating a second trim value using a difference between the second final CD target and the second desired target value, and executing a second trim process, wherein recipe settings for achieving the second final CD target have been determined using the second trim value.

2. The method as claimed in claim 1, further comprising:
executing a bottom anti-reflective coating (BARC) open process.

3. The method as claimed in claim 1, wherein executing the Iso-Greater control Strategy further comprises:
determining a first desired trim value for a the first trim process, the first desired trim value comprising a trim amount to be removed from the first value and the second value after performing the first trim process;
executing the first trim process, wherein recipe settings for achieving the first desired trim value have been determined to achieve a first trimmed value and a second trimmed value;
determining a first final CD value;
calculating a third iso-trim value using the difference between the first trimmed value and the first final CD value, wherein the first trimmed value comprises the measured data for an isolated structure less the trim amount;
calculating a third dense-trim value using the difference between the second trimmed value and the first final CD value, wherein the second trimmed value comprises measured data for a nested structure less the trim amount;
calculating a third ratio using the third iso-trim value and the third dense-trim value; and
executing the iso/nested etching process, wherein recipe settings for achieving the first final CD value have been determined using the calculated third ratio.

4. The method as claimed in claim 3, further comprising:
executing a bottom anti-reflective coating (BARC) open process.

5. The method as claimed in claim 1, wherein the executing an Iso-Greater control strategy further comprises:
executing a bottom anti-reflective coating (BARC) open process;
determining a third final critical dimension (CD) target;
calculating a third trim value using a difference between the third final CD target and the third desired target value; and
executing a third trim process, wherein recipe settings for achieving the third final CD target have been determined using the third trim value.

6. The method as claimed in claim 1, executing the Iso-Greater control strategy further comprises:
determining a first desired trim value for a the first trim process, the first desired trim value comprising a trim amount to be removed from the first value and the second value after performing the first trim process;
executing the first trim process, wherein recipe settings for achieving the first desired trim value have been determined to achieve a first trimmed value and a second trimmed value;
executing a bottom anti-reflective coating (BARC) open process;
determining a first final CD value;
calculating a third iso-trim value using the difference between the first trimmed value and the final CD value;
calculating a third dense-trim value using the difference between the second trimmed value and the first final CD value;
calculating a third ratio using the third iso-trim value and the third dense-trim value; and
executing the iso/nested etching process, wherein recipe settings for achieving the first final CD value have been determined using the calculated third ratio.

7. The method as claimed in claim 1, wherein the executing a Nes-Greater control strategy further comprises:
determining a second desired trim value for the second trim process, the second desired trim value comprising a trim amount to be removed from the first value and the second value after performing the second trim process;
executing the second trim process, wherein recipe settings for achieving the second desired trim value have been determined to achieve a first trimmed value and a second trimmed value;
determining a second final CD value;
calculating a fourth iso-trim value using the difference between the first trimmed value and the second final CD value, wherein the first trimmed value comprises the measured data for an isolated structure less the trim amount;
calculating a fourth dense-trim value using the difference between the second trimmed value and the second final CD value, wherein the second trimmed value comprises measured data for a nested structure less the trim amount;
calculating a fourth ratio using the fourth iso-trim value and the fourth dense-trim value; and
executing the iso/nested deposition process, wherein recipe settings for achieving the second final CD value have been determined using the calculated fourth ratio.

8. The method as claimed in claim 7, further comprising:
executing a bottom anti-reflective coating (BARC) open process.

9. The method as claimed in claim 1, wherein executing the Nes-Greater control strategy further comprises:
executing a bottom anti-reflective coating (BARC) open process;
determining a fourth final critical dimension (CD) target;
calculating a fourth trim value using a difference between the fourth final CD target and the second desired target value; and
executing a third trim process, wherein recipe settings for achieving the fourth final CD target have been determined using the fourth trim value.

10. The method as claimed in claim 1, wherein executing the Nes-Greater control strategy further comprises:
determining a second desired trim value for a the second trim process, the second desired trim value comprising a trim amount to be removed from the first value and the second value after performing the second trim process;

executing the second trim process, wherein recipe settings for achieving the second desired trim value have been determined to achieve a first trimmed value and a second trimmed value;
executing a bottom anti-reflective coating (BARC) open process;
determining a second final CD value;
calculating a fourth iso-trim value using the difference between the first trimmed value and the second final CD value, wherein the first trimmed value comprises the measured data for an isolated structure less the trim amount;
calculating a fourth dense-trim value using the difference between the second trimmed value and the second final CD value, wherein the second trimmed value comprises measured data for a nested structure less the trim amount;
calculating a fourth ratio using the fourth iso-trim value and the fourth dense-trim value; and
executing the iso/nested deposition process, wherein recipe settings for achieving the second final CD value have been determined using the calculated fourth ratio.

11. The method as claimed in claim 1, further comprising:
obtaining measurement data for at least one isolated structure on the wafer, wherein the measurement data is obtained using Optical Digital Profilometry (ODP);
establishing a first equation relating the measurement data to the reference metrology data for at least one isolated structure on the wafer, wherein the reference metrology data is obtained using a CDSEM; and
determining the first value using the first equation.

12. The method as claimed in claim 11, wherein the at least one isolated structure comprises a grating pattern.

13. The method as claimed in claim 1, further comprising
obtaining measurement data for at least one nested structure on the wafer, wherein the measurement data is obtained using Optical Digital Profilometry (ODP);
establishing a first equation relating the measurement data to the reference metrology data for at least one nested structure on the wafer, wherein the reference metrology data is obtained using a CDSEM; and
determining the second value using the first equation.

14. The method as claimed in claim 13, wherein the at least one nested structure comprises a grating pattern.

15. The method as claimed in claim 1, further comprising:
determining the first value, or the second value, or a combination thereof using historical data.

16. The method as claimed in claim 1, further comprising:
creating a process recipe for controlling the iso/nested etching process, wherein the process recipe comprises:
establishing a chamber pressure between approximately 5 mT and approximately 25 mT;
establishing an upper RF power between approximately 100 W and approximately 300 W;
establishing an $O_2$ flow rate between approximately 50 sccm and approximately 150 sccm;
establishing a back side He pressure between approximately 1 Torr and approximately 5 Torr in a center region and an edge region of a substrate holder;
establishing a top plate temperature between approximately 60° C. and approximately 100° C.;
establishing a chamber wall temperature between approximately 40° C. and approximately 80° C.;
establishing a substrate holder temperature between approximately 20° C. and approximately 40° C.; and
establishing a processing time from approximately 30 sec to approximately 120 sec.

17. The method as claimed in claim 1, further comprising:
creating a process recipe for controlling the iso/nested deposition process, wherein the process recipe comprises:
establishing a chamber pressure between approximately 5 mT and approximately 25 mT;
establishing an upper RF power between approximately 100 W and approximately 300 W;
establishing a lower RF power between approximately 0 W and approximately 200 W;
establishing a $CHF_3$ flow rate between approximately 150 sccm and approximately 250 sccm;
establishing a back side He pressure between approximately 1 Torr and approximately 5 Torr in a center region and an edge region of a substrate holder;
establishing a top plate temperature between approximately 60° C. and approximately 100° C.;
establishing a chamber wall temperature between approximately 40° C. and approximately 80° C.;
establishing a substrate holder temperature between approximately 20° C. and approximately 40° C.; and
establishing a processing time from approximately 50 sec to approximately 200 sec.

18. The method as claimed in claim 1, further comprising:
creating a process recipe for controlling the trimming process, wherein the process recipe comprises:
establishing a chamber pressure between approximately 5 mT and approximately 10 mT;
establishing an upper RF power between approximately 100 W and approximately 300 W;
establishing a lower RF power between approximately 0 W and approximately 150 W;
establishing an $O_2$ flow rate between approximately 5 sccm and approximately 25 sccm;
establishing a $N_2$ flow rate between approximately 5 sccm and approximately 25 sccm;
establishing a back side He pressure between approximately 1 Torr and approximately 5 Torr in a center region and an edge region of a substrate holder;
establishing a top plate temperature between approximately 60° C. and approximately 100° C.;
establishing a chamber wall temperature between approximately 40° C. and approximately 80° C.;
establishing a substrate holder temperature between approximately 55° C. and approximately 95° C.; and
establishing a processing time from approximately 5 sec to approximately 50 sec.

19. The method as claimed in claim 1, further comprising:
creating a process recipe for controlling the BARC etching process, wherein the process recipe comprises:
establishing a chamber pressure between approximately 5 mT and approximately 15 mT;
establishing an upper RF power between approximately 100 W and approximately 300 W;
establishing a lower RF power between approximately 0 W and approximately 150 W;
establishing a $CF_4$ flow rate between approximately 25 sccm and approximately 125 sccm;
establishing a $CH_2F_2$ flow rate between approximately 3 sccm and approximately 15 sccm;
establishing an $O_2$ flow rate between approximately 5 sccm and approximately 25 sccm;
establishing a back side He pressure between approximately 1 Torr and approximately 5 Torr in a center region and an edge region of a substrate holder;
establishing a top plate temperature between approximately 60° C. and approximately 100° C.;

establishing a chamber wall temperature between approximately 40° C. and approximately 80° C.;

establishing a substrate holder temperature between approximately 55° C. and approximately 95° C.; and establishing a processing time from approximately 5 sec to approximately 100 sec.

* * * * *